United States Patent [19]

Nishiguchi

[11] Patent Number: 5,151,983

[45] Date of Patent: Sep. 29, 1992

[54] MICROCOMPUTER SYSTEM WITH SELECTIVELY BYPASSED MEMORY OUTPUT LATCHES

[76] Inventor: Yukihiro Nishiguchi, c/o NEC Corporation, 33-1, Shiba 5-chome, Minato-ku, Tokyo, Japan

[21] Appl. No.: 325,803

[22] Filed: Mar. 20, 1989

[30] Foreign Application Priority Data

Mar. 18, 1988 [JP] Japan .................. 63-66455
May 25, 1988 [JP] Japan .................. 63-128842

[51] Int. Cl.⁵ .............. G06F 13/00; G06F 13/12; G11C 7/00
[52] U.S. Cl. .................. 395/425; 395/375; 365/189.05; 365/239
[58] Field of Search ........... 365/189.05, 230.08, 365/239, 238.5; 364/200 MS File, 900 MS File

[56] References Cited

U.S. PATENT DOCUMENTS

| | | | |
|---|---|---|---|
| 3,969,724 | 7/1976 | Anderson et al. | 364/200 |
| 4,280,199 | 7/1981 | Osakabe et al. | 365/239 X |
| 4,293,908 | 10/1981 | Bradley et al. | 364/200 |
| 4,802,125 | 1/1989 | Yamada | 365/230.08 |
| 4,882,710 | 11/1989 | Hashimoto et al. | 365/189.05 |

Primary Examiner—Alyssa H. Bowler

[57] ABSTRACT

A microcomputer system includes a memory storing various processing data including instruction codes, and a data processor for executing an instruction. The memory includes an address pointer for indicating an address for the memory and supplying the stored address to the memory, and an incrementer for incrementing the address pointer. A latch is coupled to the memory for holding an output of the memory read out in accordance with the address supplied from the address pointer. A bus interface is provided for controlling the address pointer and the incrementer so as to cause a one-time transfer to be performed between the memory and the data processor after an address is supplied from the data processor to the address pointer. The bus interface also controls the address pointer, the incrementer and the latch so that the latch holds contents which are read out from the memory at the address supplied by the address pointer, and the incrementer to increment the address pointer, whereby a continuous transfer is realized between the memory and the data processor without continuously supplying addresses from the data processor.

4 Claims, 18 Drawing Sheets

MICROCOMPUTER SYSTEM WITH SELECTIVELY BYPASSED MEMORY OUTPUT LATCHES

BACKGROUND OF THE INVENTION

1. Field of the Invention

The present invention relates to a microcomputer system including a microprocessor and a memory, and more specifically to a memory chip coupled to a microcomputer system and capable of allowing an associated microprocessor to read data and/or program from the memory chip at a high speed.

2. Description of the Related Art

At present, microprocessors have been not only of a low power consumption because of adoption of CMOS (complementary metal-oxide-semiconductor) devices, but also able to process instructions at a very high speed as a result of improvements of the architecture. On the other hand, an access to a memory for reading a program and/or data is still limited to a speed lower than an instruction execution speed of the microprocessors themselves. As a result, the total instruction execution time of the microprocessors have not yet been brought to a sufficient low value which would be realized by the speed-up of the microprocessor itself. Particularly, as in case of reading a program, when a series of instruction codes stored at continuous addresses are read out, a great portion of the processing time of the microprocessor has been consumed as a wait time for the instruction codes read out from the memory, and therefore, the processing speed of the overall microcomputer system has still been at a low level. In this connection, since the memory has been ceaselessly maintained in an operating condition, even if the microprocessor does not access to the memory, the memory will consume a substantial electric power. This is one of the causes preventing the power saving of the overall microcomputer system.

SUMMARY OF THE INVENTION

Accordingly, it is an object of the present invention to provide a microcomputer system which has overcome the above mentioned defect of the conventional one.

Another object of the present invention is to provide a microcomputer system capable of reading a program and/or data from an associated memory at a high speed.

A further object of the present invention is to provide a microcomputer system having a memory of a low power consumption.

The above and other objects of the present invention are achieved in accordance with the present invention by a microcomputer system which includes memory means storing various processing data including instruction codes, and data processing means for executing a given instruction, comprising address indication means for storing an address for the memory means and supplying the stored address to the memory means, updating means for updating a content of the address indication means, hold means for holding a content read out from the memory means in accordance with the address supplied from the address indication means, control means for controlling the updating means and the hold means, first transfer means for controlling the address indication means and the hold means so as to cause a one-time transfer to be performed between the memory means and the data processing means after an address is supplied from the data processing means to the address indication means, and second transfer means for putting the control means in an operating condition to cause the hold means to hold contents which are read out from the memory means at the address supplied by the address indication means, and to cause the updating means to update the content of the address indication means, whereby a continuous transfer is realized between the memory means and the data processing means without continuously supplying addresses from the data processing means.

In one preferred embodiment, the microcomputer system generates a basic operation clock, and the update means and the hold means are controlled by the control means in synchronization with the basic operation clock.

In another preferred embodiment, the microcomputer system further includes means for designating an address space in which the memory means is located, means for detecting whether or not the address indicated by the address indication means is within the address space designated by the address designation means, before the address indicated by the address indication means is supplied to the memory means, and means for putting the memory means into an operating condition on the basis of the detection result of the detection means.

The above and other objects, features and advantages of the present invention will be apparent from the following description of preferred embodiments of the invention with reference to the accompanying drawings.

DESCRIPTION OF THE PREFERRED EMBODIMENTS

Figure 1:
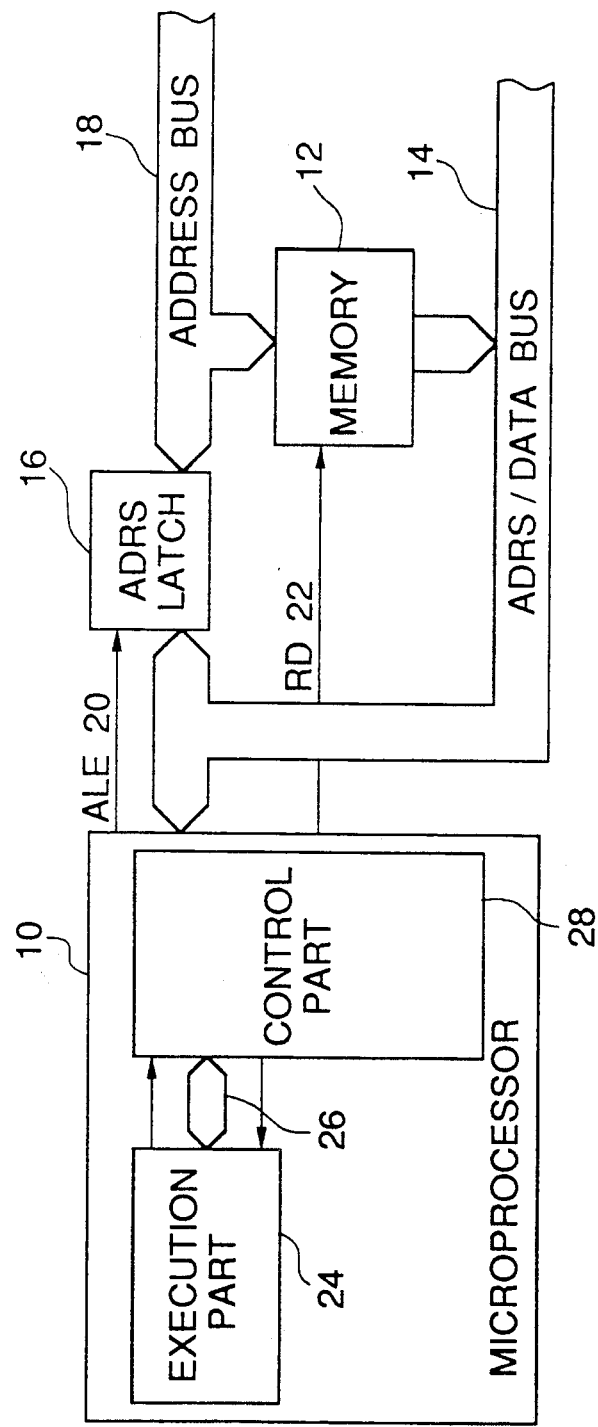
FIG. 1 is a block diagram of a typical example of a conventional microcomputer system.

Referring to FIG. 1, there is shown a block diagram of a typical example of a conventional microcomputer system, which includes a microprocessor 10 and a memory 12 for storing programs and data. The microcomputer system will be often called "microcomputer" hereinafter for simplification.

In the shown microcomputer, the microprocessor 10 controls a data input/output processing and an operation of the overall microcomputer system. The microprocessor 10 is coupled through an address/data bus (called "A/D bus" hereinafter) 14 to the memory 12 and an address latch 16, which is in turn coupled through an address bus 18 to the memory 12. The address latch 16 operates to demultiplex a multiplexed address and instruction code/input data outputted from the microprocessor 10. Further, the microprocessor 10 outputs an address latch enable (ALE) signal 20 to the address latch 16 and a read (RD) signal 22 to the memory 12.

Now, an operation of the microcomputer system for sequentially reading a series of instruction codes stored at continuous addresses will be explained with reference to FIG. 2, which shows the timing chart of the operation of the microprocessor and signals appearing on the A/D bus 14 and the address bus 18.

Figure 2:
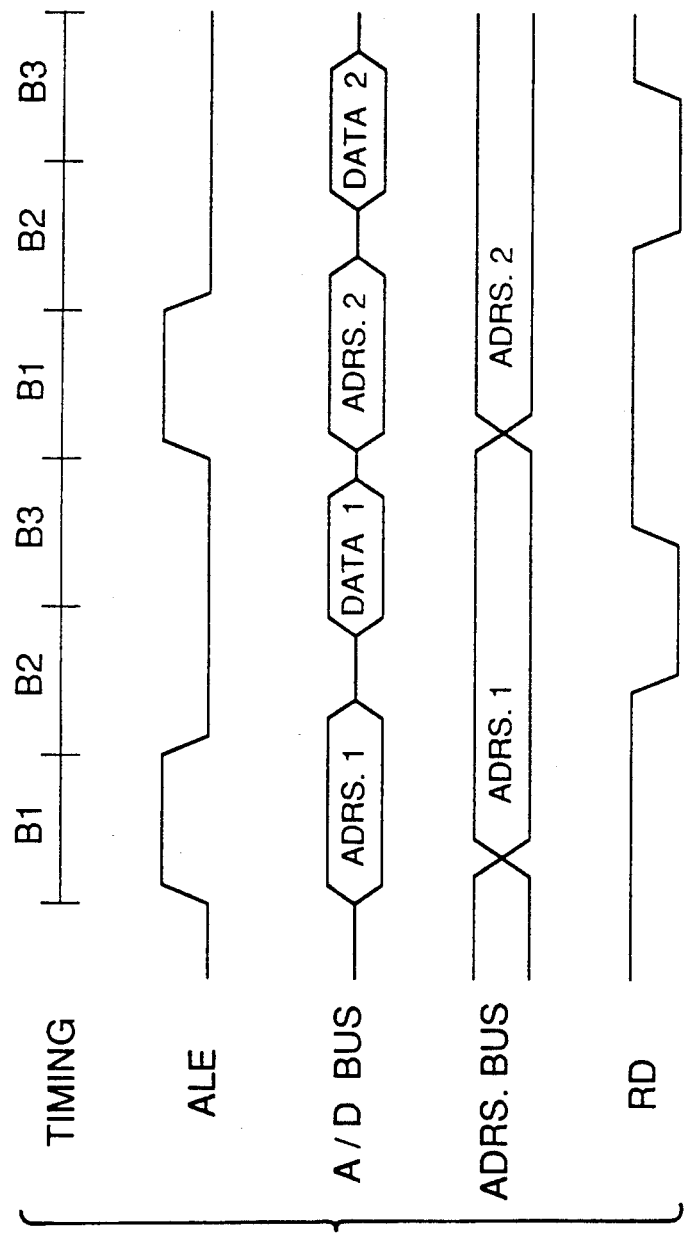
FIG. 2 is the timing chart illustrating the operation of the microprocessor shown in FIG. 1.

In the prior art, the reading of each instruction code of the program and the reading of data have been performed with three basic states B1, B2 and B3 as shown in FIG. 2. In case of reading data from the memory, the microprocessor 10 maintains the ALE signal 20 at an active high level during the first state B1, and on the other hand, outputs a reading address to the A/D bus 14 for a period from the state B1 to the state B2. Thereafter, the microprocessor brings the RD signal 22 to an active low level for a period starting an intermediate point of the state B2 and terminating an intermediate point of the state B3, so that data is read out from a location of the memory 12 designated by the address on the address bus 18 (namely, latched by the address latch 16) to the A/D bus 14 in synchronization with the RD signal 22. As a result, the microprocessor 10 fetches the data on the A/D bus 14 at a predetermined timing within the state B3. Thus, one cycle for reading data from the memory has been completed.

In general, a program is stored in continuous memory locations having sequential addresses. Therefore, the microprocessor 10 reads and then executes the program through the A/D bus 14 from the memory 12 by repeating the above mentioned data read cycle in the order of the addresses. However, reviewing an internal operation of the microprocessor 10 in the course of this program reading, an instruction execution part 24 of the microprocessor 10 will merely be in a wait condition after the instruction execution part 24 outputs an address through an internal address bus 26 and an execution control part 28 to the A/D bus 14 in the state B1 until the instruction execution part 24 receives the data corresponding to the outputted address at an intermediate point of the state B3. This waiting time is an idle time to the execution part 24, and therefore, simply decreases the processing power or speed of the overall microcomputer system.

In the prior art, as mention above, the time required for reading the program from the memory has been much longer than that required for execution of a given instruction. Therefore, in the data read cycle, the microprocessor has been very frequently put in the wait condition. As a result, in spite of the fact that the microprocessor itself has a sufficient processing power, it has not been utilized in order to improve the processing speed.

In addition, the memory 12 is ceaselessly maintained in an operating condition, and therefore, will consume an electric power even when the microprocessor 10 accesses an LSI (not shown) which is coupled to the A/D bus 14 but is other than the memory 12. In this point, the microcomputer system cannot save the power consumption.

Figure 3:
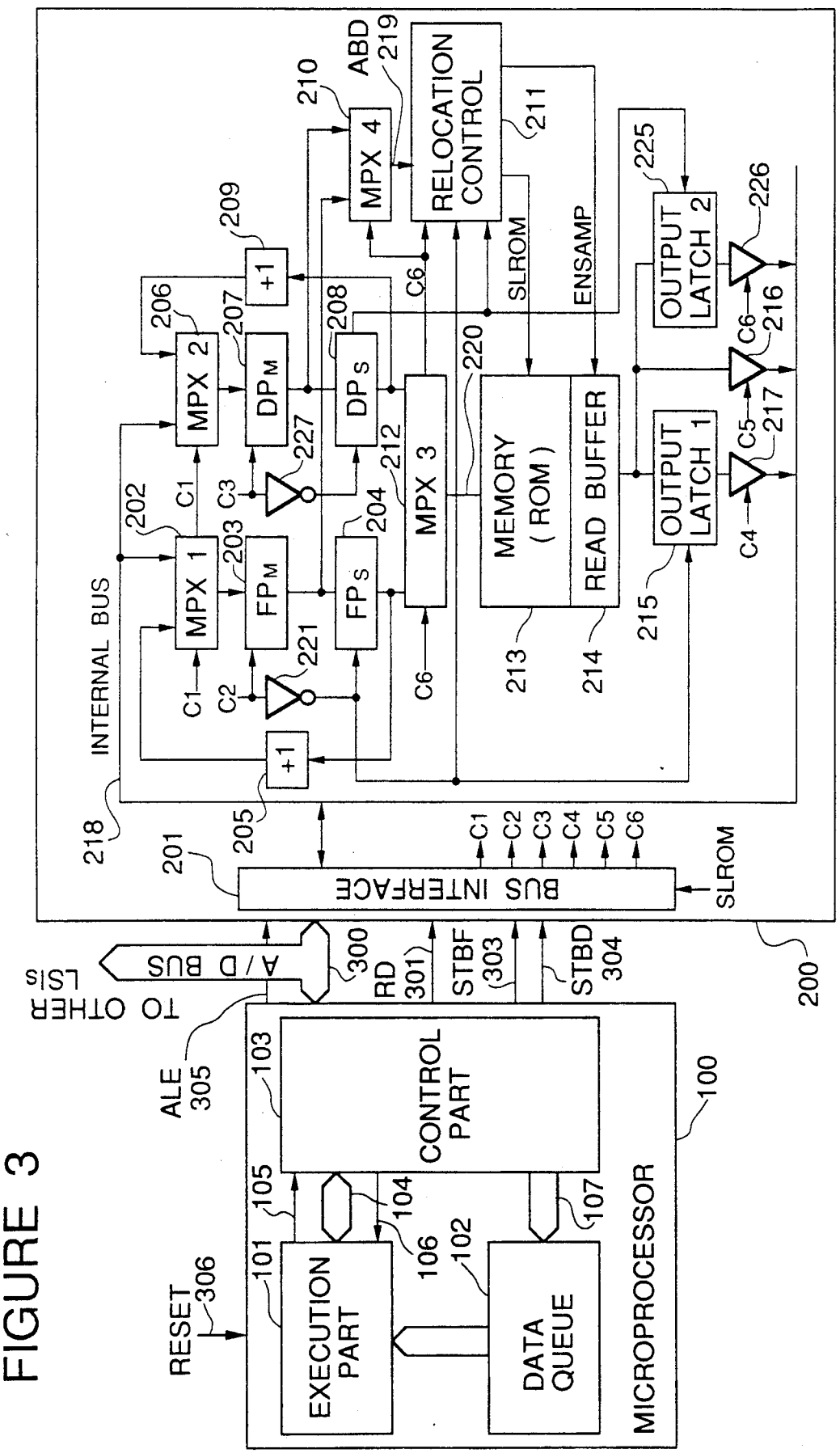
FIG. 3 is a block diagram of a first embodiment of the microcomputer system in accordance with the present invention.

Referring to FIG. 3, there is shown a block diagram of a first embodiment of the microcomputer system in accordance with the present invention. The shown microcomputer system includes a microprocessor 100 for performing a data input/output and an arithmetic and logic operation and also for controlling the whole of the microcomputer system, and an LSI (large scaled integrated circuit) chip 200 containing therein a memory 213 such as a read only memory for storing a program to be executed by the microprocessor 100 and data required for the arithmetic and logic operation performed by the microprocessor. This read only memory will be often called "memory" hereinafter for simplification.

The microprocessor 100 includes an execution part 101 for executing a given instruction, a data queue 102 for storing instructions and data read from the memory 213, in the order of reading-out, so as to supply its stored content to the execution part 101 in response to a request from the execution part 101, and a control part 103 for controlling an overall operation of the microprocessor 100.

As the result of the execution of the instruction, the execution part 101 outputs an address for a location of the memory 214 to be accessed, to the control part 103 through an address bus 104, and also generates a bus request signal 105 which requests a cycle for reading data from the memory 214 within the LSI 200. The bus request signal 105 is supplied to the control part 103. On the other hand, the control part 103 outputs an acknowledge signal 106 to the execution part 101 as the result of a start of a read cycle. The microprocessor 100 is coupled to the LSI 200 through an A/D bus 300 on which an address and data are transferred in a multiplexed manner. Therefore, the microprocessor 100 outputs the address to the memory 213 of the LSI 200 through the A/D bus 300, and then receives through the A/D bus 300 the data or instruction read out from the memory 213. The control part 103 supplies the received data or instruction to the data queue 102 through another bus 107.

On the other hand, the LSI 200 includes a bus interface 201 receiving various outputs from the microprocessor 100 for generating various control signals C1, C2, C3, C4, C5 and C6, the memory 213 mentioned above for storing the program and the data for the microprocessor 100, and an internal bus 218 coupled to the bus interface 201. Therefore, the address which has been inputted through the external A/D bus 300 to the LSI 200 is introduced to an internal of the LSI 200 through the bus interface 201 and the internal bus 218.

A pair of pointers ($FP_M$ and $FP_S$) 203 and 204 of the master-slave construction are controlled by the control signal C2 generated in a read cycle of an instruction code explained hereinafter, and operate to latch the address on the internal bus 218 through an multiplexor (MPX 1) 202 having a first input connected to the internal bus 218. Here, the suffix "M" means a master of the master-slave construction, and the suffix "S" means a slave of the master-slave construction. Specifically, the control signal C2 is supplied directly to the master pointer ($FP_M$) 203 on one hand, and through an inverter 221 to the slave pointer ($FP_S$) 204 on the other hand. An output of the slave pointer ($FP_S$) 204 is connected to an incrementer 205, whose output is connected to a second input of the multiplexor (MPX 1) 202. The multiplexor (MPX 1) 202 operates to select the output of the incrementer 205 in synchronization with the control signal C1 which is generated in a continuous instruction code read cycle and in a continuous data read cycle both explained hereinafter.

In addition, another pair of pointers (DPM and DPS) 207 and 208 of the master-slave construction are controlled by the control signal C3 generated in a read cycle of data, and operate to latch the address on the internal bus 218 through another multiplexor (MPX 2) 206 having a first input connected to the internal bus 218. The control signal C2 is supplied directly to the master pointer (DPM) 207 on one hand, and through an inverter 227 to the slave pointer DPS, 208 on the other hand. An output of the slave pointer (DPS) 208 is connected to an incrementer 209, whose output is connected to a second input of the multiplexor (MPX 2) 206. The multiplexor (MPX 2) 206 operates to select the output of the incrementer 209 in synchronization with the control signal C1.

The control signal C6 is generated in the continuous instruction code read cycle, and is supplied to a third multiplexor (MPX 3) 212 which having a first input connected to an output of the slave pointer (FPS) 204 and a second input connected to an output of the slave pointer (DPS) 208. The multiplexor (MPX 3) 212 has an output connected through an AB bus 220 to an address input of the memory 213, and operates to select and output the output of the slave pointer (FPS) 204 to the memory 213 in response to the control signal C6.

The control signal C6 is also is supplied to a fourth multiplexor (MPX 4) 210 which having a first input connected to an output of the master pointer (FPM) 203 and a second input connected to an output of the master pointer (DPM) 207. The multiplexor (MPX 4) 210 has an output connected through an ABD bus 219 to a relocation control 211, and operates to select and output the output of the master pointer (FPM) 203 to the relocation control 211 in response to the control signal C6.

This relocation control 211 also receives an inverted signal of the control signal C2 from the inverter 221 and an inverted signal of the control signal C3 from the inverter 227, and generates a SLROM signal designating a memory space of the memory 213 and a ENSAMP signal for controlling an operation of a reading buffer 214 associated to the memory 213. Therefore, the SLROM signal is inputted to the bus interface 201 and the memory 213, and the ENSAMP signal is inputted to the reading buffer 214 associated to the memory 213.

The reading buffer 214 has an output connected to a first output latch 215 used for holding a read instruction code when instruction codes are continuously read out from the memory 213. The output latch 215 receives at its control input the inverted signal of the control signal C2 from the inverter 221. An output of the latch 215 is connected to an input of an output buffer 217 which is controlled by the control signal C4 and has an output connected to the internal bus 218. The output of the reading buffer 214 is also connected to a second output buffer 216 which is controlled by the control signal C5 and has an output connected to the internal bus 218. Furthermore, the output of the reading buffer 214 is also connected to a second output latch 225 used for holding data when data is continuously read out from the memory 213. The output latch 215 receives at its control input the inverted signal of the control signal C3 from the inverter 227. An output of the latch 225 is connected to an input of a third output buffer 226 which is controlled by the control signal C6 and has an output connected to the internal bus 218.

Explanation will be made on the control signals inputted to or outputted from the microprocessor 100 and the LSI 200.

A reset signal 306 is inputted to the microprocessor 100 for initialize the internal hardwares of the microprocessor 100. On the other hand, the microprocessor 100 generates an address latch enable (ALE) signal 305 for causing the address on the A/D bus 300 to be latched to the master pointer (FPM) 203 or (FPM) 207, and a read (RD) signal 305 for reading data (or instruction code) from the memory 213. The RD signal 301 is active when it is at a low level. The microprocessor 100 also generates a first strobe signal (STBF) 303 for controlling the timing for causing the address on the A/D bus 300 to be latched by the master pointer (FPM) 203 (namely, for control the generation of the control signal C2) and for determining the timing at which an instruction code is read out from the memory 213 in the continuous instruction code read cycle. Furthermore, the microprocessor 100 generates a second strobe signal (STBD) 304 for controlling the timing for causing the address on the A/D bus 300 to be latched by the master pointer (DPM) 207 (namely, for control the generation of the control signal C3) and for determining the timing at which data is read out from the memory 213 in the continuous data read cycle.

Under the above mentioned condition, when the ALE signal 305 is "1" and the STBD signal 304 is "0", the continuous instruction code read cycle is set, and thereafter, an instruction code is read out from the memory 213 to the A/D bus 300 in synchronization with a rising edge of each STBF signal 303. When the ALE signal 305 is "1", if the STBD signal 304 is "1" but the STBF signal 303 is "1", the continuous data read cycle is set, and thereafter, data is read out from the memory 213 to the A/D bus 300 in synchronization with a rising edge of each STBF signal 303. However, when the ALE signal 305 is "1", if both the STBD signal 304 and the STBF signal 303 are "1", a one-time data read cycle is set, and data is read out from the memory 213 to the A/D bus 300 in synchronization with the RD signal.

Figure 4:
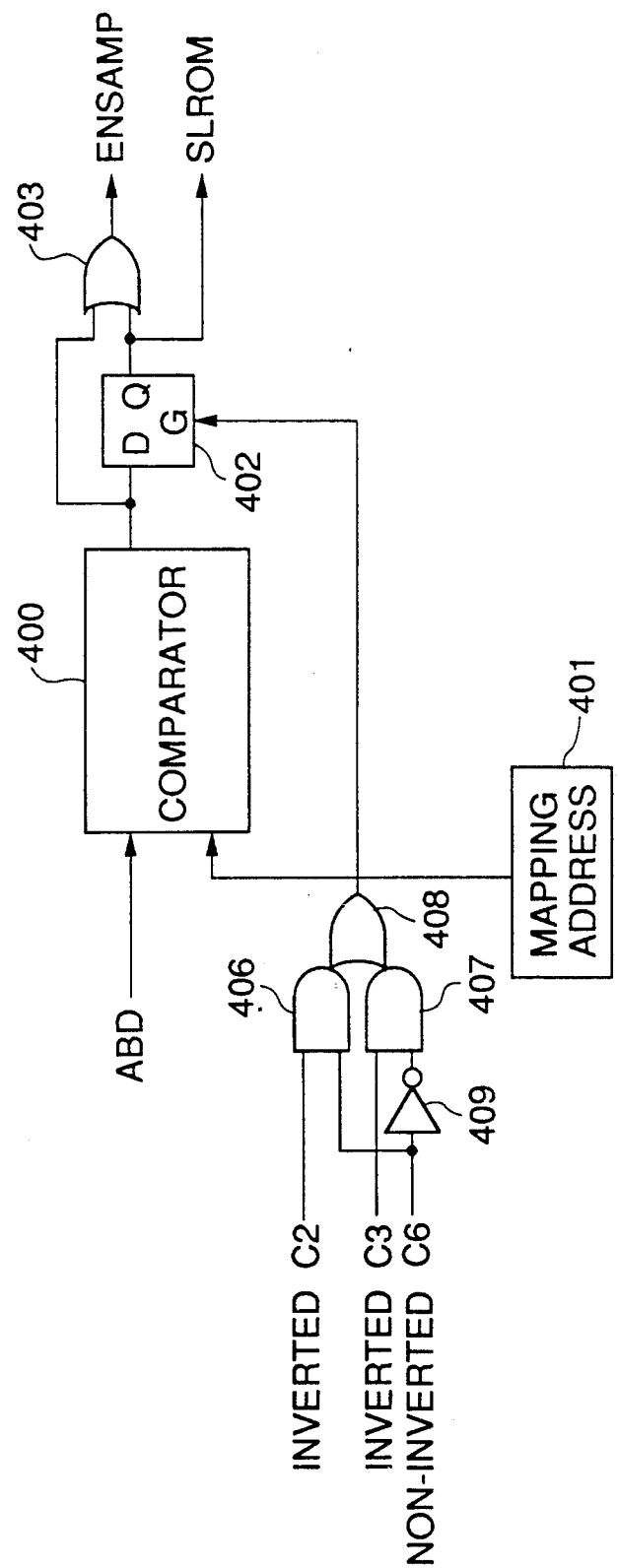
FIG. 4 is a logic diagram of the relocation control used in the microcomputer system shown in FIG. 3.

Turning to FIG. 4, there is shown a logic diagram of the relocation control 211. The relocation control 211 includes a comparator 400 having a first input connected to the ABD bus 219 and a second input connected to a mapping address designation circuit 401 for designating an address space in which the memory 213 is located. Therefore, the comparator 400 compares the address on the address on the ABD bus 219 with the output of the mapping address designation circuit 401, and generates an active output when the address in the pointer (FPM) 203 or (DPM) 207 is consistent with the data supplied from the mapping address designation circuit 401, namely, when the address in the pointer (FPM) 203 or (DPM) 207 is included within the designated address space for the memory 213. The active output of the comparator 400 is supplied to an OR gate 403, which in turn generates the ENSAMP signal of "1" for enabling the operation of the reading buffer 214.

The output of the comparator 400 is also connected to a latch 402 such as a D-type flipflop, whose output generates the SLROM signal and is connected to the OR gate 403. The inverted C2 signal outputted from the inverter 221 is connected to one input of an AND gate 406, and the inverted C3 signal outputted from the inverter 227 is connected to one input of another AND gate 407. The other input of the AND gate 406 is connected to receive the control signal C6, and the other input of the AND gate 407 is connected to an output of an inverter 409 which receives at its input the control signal C6. Outputs of the two AND gates 406 and 407 are connected to an OR gate 408 which is connected at its output to a latch control input of the latch 402.

With the above arrangement, in the continuous instruction code read cycle, since the control signal is brought to "1", when the inverted C2 signal (the output of the inverter 221) is rendered to "1", the latch 402 generates the SLROM signal of "1" if the output of the comparator 400 is "1" which means that the address in the pointer (FPM) 203 or (DPM) 207 is included within the designated address space for the memory 213. Therefore, the memory 213 is selected and becomes accessible. In the other read cycles, on the other hand, since the control signal C6 is of "0", when the inverted C3 signal (the output of the inverter 227) is rendered to "1", the latch 402 generates the SLROM signal of "1" if the output of the comparator 400 is "1".

Here, the following should be noted before an operation of the above microcomputer system will be explained: In general, the reading buffer 214 is of the CMOS structure for reading data and/or instruction from the memory 213 at a high speed. Nevertheless, the reading buffer 214 has the construction in which the reading buffer 214 will ceaselessly consume the electric power if the ENSAMP signal is "1" even if the data does not change. In addition, when the ENSAMP signal is brought from "0" to "1", namely when the reading buffer 214 is caused to be changed from a not-operating condition to an operating condition, it will entail a predetermined time tBUf until it becomes a stable operating condition. Further, only when the SLROM signal is of "1", the bus interface 201 supplies to the A/D bus 300 with the content read out from the memory 213.

Figure 5:
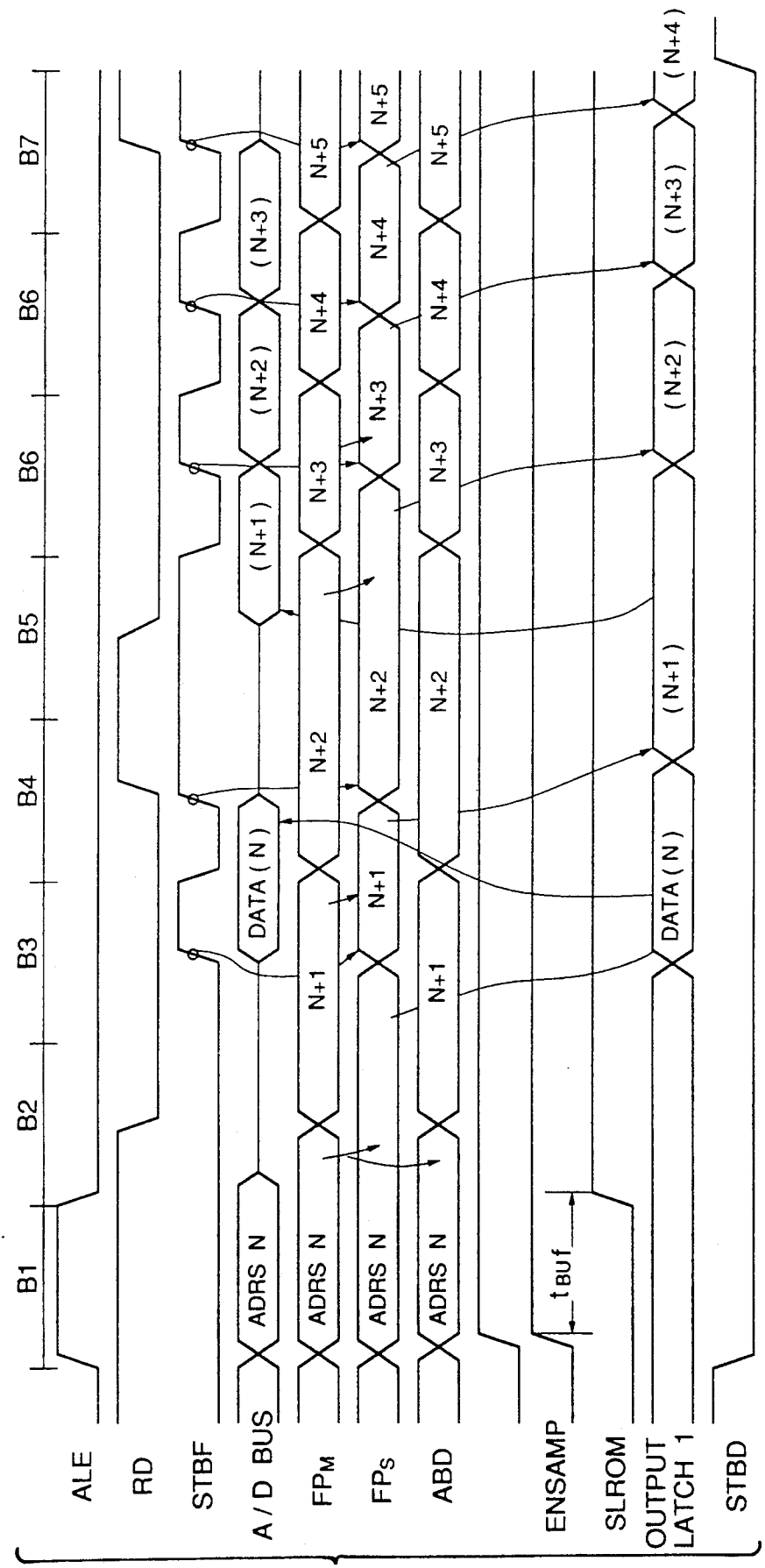
FIG. 5 is the timing chart illustrating the operation of the microprocessor shown in FIG. 4 in the continuous instruction code read cycle, but in the case that all addresses are within the mapping address space of the memory.

Now, the continuous instruction code read cycle of the above mentioned microcomputer system will be explained with reference to FIG. 5.

The continuous instruction code read cycle is composed of four basic states B1, B2, B3 and B4 for setting an address, and three states B5, B6 and B7 succeeding to the basic states for the continuous instruction code reading. Each of the states is composed of a plurality of clocks, and in the respective states, the control part 103 of the microprocessor 100 outputs the above mentioned various control signals to the LSI 200 for the purpose of controlling the cycle for reading the content of the memory 213. Incidentally, in order to continue or maintain the continuous instruction code reading, the state B6 is repeated. And, assume that all addresses N, N+1, N+2, N+3, N+4 and N+5 appearing in FIG. 5 are included in the address space designated by the mapping address designation circuit 401.

First, in the state B1, the microprocessor 100 brings the ALE signal 305 to "1" and the STBF signal 303 and the STBD signal 304 to "0", respectively. In addition, the microprocessor 100 outputs the address N onto the A/D bus 300. On the other hand, the bus interface 201 of the LSI 200 brings the control signals C1, C2 and C6 to "1", respectively, and outputs the address N on the A/D bus 300 to the internal bus 218. As result, the address N is written to the master pointer (FPM) 203 through the multiplexor 202 receiving the control signal C1 of "1", and therefore, is outputted onto the ABD bus 219 through the multiplexor 210 also receiving the control signal C6 of "1". Since the address N is consistent with the address designated by the mapping address designation circuit 401, the ENSAMP signal is brought to "1", which activates the reading buffer 214.

In the state B2, the microprocessor 100 brings the ALE signal 305 to "0" and outputs neither data nor address onto the A/D bus 300. This condition will be called a "high impedance condition" of the A/D bus 300. In response to this condition, the bus interface 201 of the LSI 200 brings the control signals C1, C2 and C6 to "0", "0" and "1", respectively. As a result, the address N stored in the master pointer (FPM) 203 is transferred to the slave pointer (FPS) 204 so that the address N is outputted through the multiplexor 212 onto the bus 220 connected to the memory 213. On the other hand, since the inverted C2 signal becomes "1", the latch 402 latches the output of "1" of the comparator 400, and therefore, the SLROM signal is brought to "1", so that the content of the memory 213 is read out, as an instruction code, from a location corresponding to the address N, and then, is written to the latch 215, since the latch 215 receives the inverted C2 signal of "1". This output latch 215 is of the master-slave construction, and therefore, outputs a previously latched content when the inverted C2 signal (the output of the inverter 221) is at "0".

At an intermediate point of the state B2, the microprocessor 100 brings the RD signal 301 to "0". In response to this change of the RD signal, the bus interface 201 brings the control signal C2 to "1" again, and realizes a condition in which the content on the internal bus 218 can be outputted onto the A/D bus 300. At this time, the control signal C6 is maintained at "1". Thus, when the control signal C2 is brought to "1", an address N+1 obtained by incrementing the content (the address N) of the slave pointer 204 by means of the incrementer 205. is written to the master pointer 203 through the multiplexor 202. At time. since the address N+1 is in the extent of address designated by the mapping address designation circuit 401. the ENSAMP signal is still maintained at "1".

At an intermediate point of the state B3. the microprocessor 100 brings the SABF signal to the "1", and as a result, the bus interface 201 changes the control signal C2 to "0". In response to the control signal C2 of "0", the address N+1 is outputted through the AB bus 220 to the memory 213, so that a location of the memory corresponding to the address N+1 is accessed. At the same time. the control signal C4 is brought into "1", so that the output of the output latch 215, namely. data (N) read out from the location of the address N of the memory 213. is outputted to the internal bus 218, and then through the bus interface 201 to the A/D bus 300.

Thereafter, at a predetermined timing within a first half of the state B4, the microprocessor 100 fetches the data (N) on the A/D bus 300, and then. write the data (N) is outputted onto the data bus 107 by the control part 103 so that the data (N) is written into the data queue 102. As a result. the execution part 101 decodes the data (N) as an instruction code, and executes the corresponding arithmetic and logic operation.

On the other hand, the microprocessor 100 brings the STBF signal 303 to "0" at the beginning of the state B4. and therefore. the bus interface 201 correspondingly brings the control signal C2 to "1". In response to the change of the control signal C2 to "1", the address N+2 is inputted from the incrementer 205 through the multiplexor 202 to the master pointer 203.

At the intermediate point of the state B4. the microprocessor 100 brings the RD signal 301 and the STBF signal 303 to "1", respectively. As a result, the bus interface 201 brings the A/D bus 300 into a high impedance condition, and the control signal C2 to "0", again. Thus, the content of the output latch 215, namely, the data (N+1) is outputted onto the internal bus 218. Thereafter, the microprocessor 100 brings the RD signal 301 to "0", so that the bus interface 201 transfers the data (N+1) on the internal bus 218 to the A/D bus 300.

At the beginning of the state B6, the microprocessor 100 brings the STBF signal 303 to "0". In addition, similarly to the state 4, the data (N+1) on the A/D bus 300 is written to the data queue 102.

Thereafter, at each time the STBF signal 303 is brought from "0" to "1", the contents stored at continuous addresses of the memory 213 are outputted onto the A/D bus 300 and then inputted to the microprocessor. Therefore, when an instruction code is outputted, a next address is accessed. Accordingly, continuous instruction codes are read out at a high speed.

When the STBF signal 303 is brought from "1" to "0", whether or not the content of the ABD bus 219 is within the address space designated by the mapping address designation circuit 401 is discriminated. If it is discriminated that the content of the ABD bus 219 is within the designated address space, the ENSAMP signal and the SLROM signal are brought to "1", respectively. To the contrary, if it is discriminated that the content of the ABD bus 219 is not within the designated address space, the ENSAMP signal and the SLROM signal are brought to "0", respectively, so that the reading buffer 214 is brought into a not-operating condition. In this regard, the memory is power-saving.

If the microprocessor 100 repeats the state B6. the continuous instruction code read cycle is continued, and when the state B7 is generated. the the continuous instruction code read cycle is terminated. The state B7 is similar to the state B4. and therefore. explanation of the state B7 will be omitted.

In the above mentioned continuous instruction code read cycle, the memory is controlled to be accessed by bringing the SLROM signal to "1" when the time tBUf has elapsed after the ENSAMP signal is brought to "1" in the state B1 for putting the reading buffer 214 into an operating (conductive) condition. Since the reading buffer 214 is brought into a stable operating condition within the time tBUf, it is possible to read data (or instruction code).

Next, with reference to FIG. 6. explanation will be made on an operation in the case that an address stored in the master pointer (FPM) 203 is out of the address space designated by the mapping address designation circuit 401.

Figure 6:
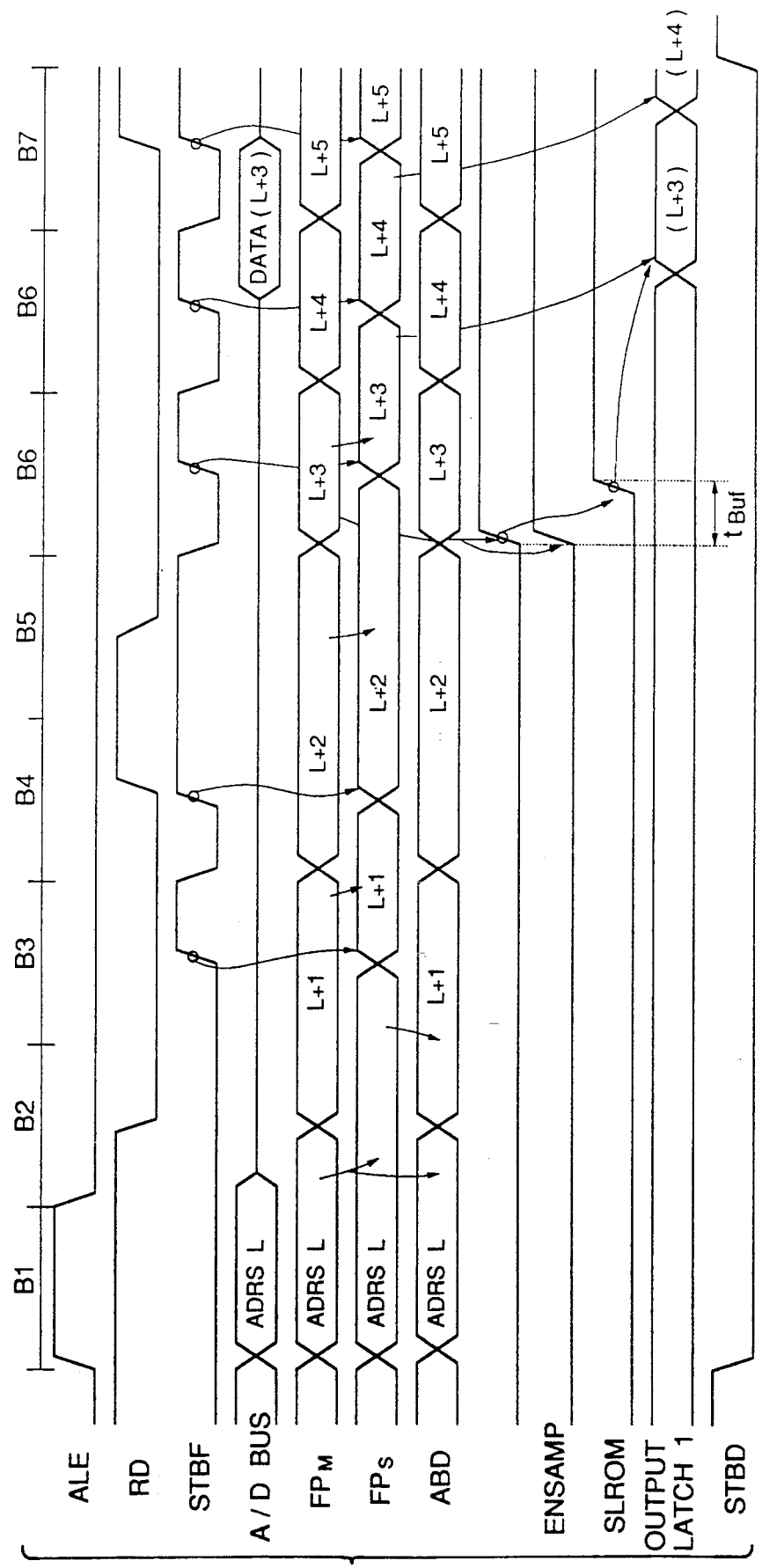
FIG. 6 is the timing chart similar to FIG. 5 but illustrating the operation of the continuous instruction code read cycle in the case that some of addresses are out of the mapping address space of the memory.

In FIG. 6, assume that addresses L. L+1 and L+2 are out of the address space designated by the mapping address designation circuit 401 and address L+3 and L+4 are within the designated address space. Under this condition, the ENSAMP signal is maintained at "0" in the states B1. B2. B3. B4 and B5. In the state B6. the address on the ABD bus 219 becomes L+3, the ENSAMP signal is brought to "1", and then, the SLROM signal is also brought to "1" at an intermediate point of the state B6. so that the memory is put into an accessible condition. When the SLROM signal is brought to "1", data (L+3) is outputted onto the A/D bus 300. In this case, the memory is controlled so that the time tBUf is ensured after the ENSAMP signal is brought to "1" before the SLROM signal is brought to "1".

As mentioned above, if the memory 213 is out of the designated address, the reading operation of the memory 213 which is a main operation of the LSI 200 will not be performed, and therefore, the LSI is power-saving.

Figure 7:
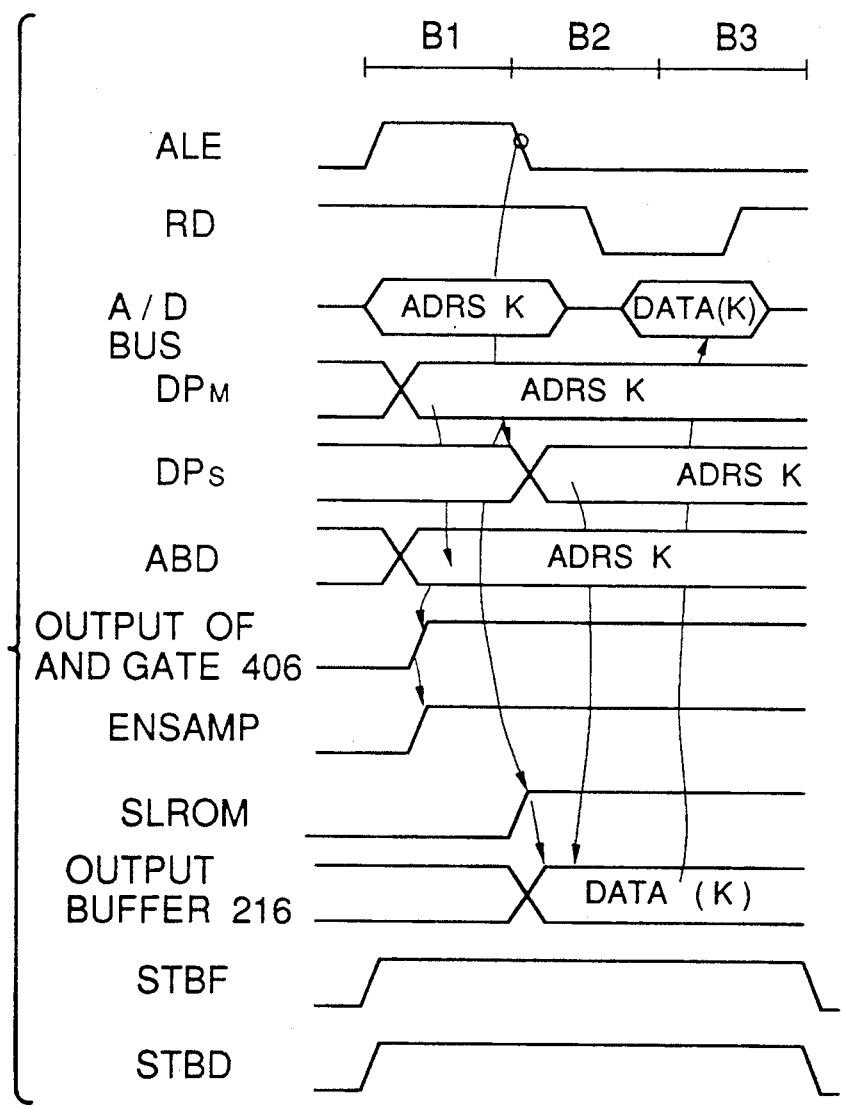
FIG. 7 is the timing chart illustrating the operation of the microprocessor shown in FIG. 4 in the one-time data read cycle.

Now, a one-time data read cycle of the microcomputer system will be explained with reference to FIG. 7.

One data read cycle is composed of three state B1, B2 and B3. In the state B1, the microprocessor 100 brings the ALE signal 305, the STBF signal 303 and STBD signal 304 to "1", respectively. In addition, the microprocessor 100 outputs an address K onto the A/D bus 300. In response to these outputs of the microprocessor 100, the bus interface 201 of the LSI brings control signals C1, C3 and C6 to "1", "1" and "0", respectively. Accordingly, the address K is written to the master pointer (DPM) 207 by the multiplexor 206 controlled by the control signal C1 of "1", and also inputted to the relocation control 211 through the multiplexor 210 since the control signal C6 is "0". If the address K is in the address space designated by mapping address designation circuit 401, the ENSAMP signal of "1" is generated.

In the next state B2, microprocessor 100 brings the ALE signal to "0", and accordingly, the bus interface 201 brings the control signal C3 to "0", so that the address K is written from the master pointer (DPM) 207 to the slave pointer (DPS) 208. The address K in the slave pointer (DPS) 208 is inputted through the multiplexor 212 to the memory 213. At the same time, the SLROM signal is brought to "1", and the control signal C5 is brought to "1". Therefore, data (K) read out from a location of the memory 213 designated by the address K, and outputted through the output buffer 216 to the internal bus 218. On the other hand, microprocessor 100 brings the RD signal 301 to "0" at an intermediate point of the state B2, and therefore, the bus interface 201 outputs the data K onto the A/D bus 300, which is fetched by the microprocessor 100 at a predetermined timing within the state B3 and then used by the execution part 101 as the data for the arithmetic and logic operation.

Figure 8:
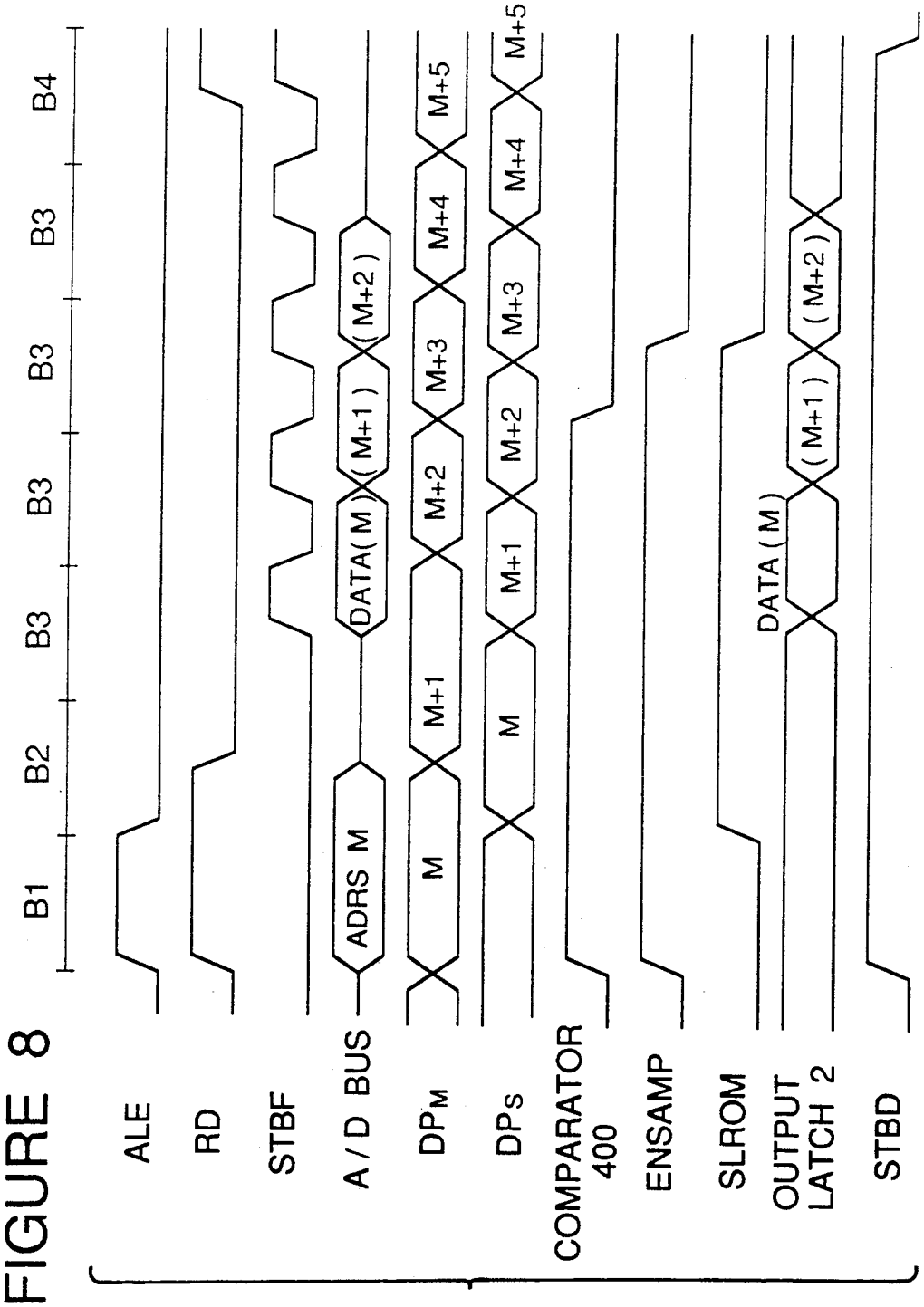
FIG. 8 is the timing chart illustrating the operation of the microprocessor shown in FIG. 4 in the continuous data read cycle.

FIG. 8 illustrates the operation of the continuous data read cycle. The continuous data read cycle is constituted of basic states B1, B2, B3 and B4, and the continuous data reading is realized by repeating the state B3. In the state B1, the microprocessor 100 brings the ALE signal 305, the STBF signal 303 and the STBD signal 304 to "1", "0" and "1", respectively. In addition, the microprocessor 100 outputs an address M onto the A/D bus 300. In response to the outputs of the microprocessor 100, the bus interface 201 of the LSI 200 brings the control signals C1, C3 and C6 to "1", "1" and "0", respectively. In response to the control signal C3 of "1", the address M is written to the master pointer 207 through the multiplexor 206 receiving the control signal C1 of "1", and on the other hand, in response to the control signal C6 of "0", the multiplexors 212 and 210 select the output of the slave pointer (DPS) 208 and the output of the master pointer (DPM) 207, respectively.

Thereafter, similarly to the continuous instruction code reading cycle, the content of the master pointer (DPS) 208 is incremented in synchronization to the rising edge of the STBF signal 303, and the incremented address is outputted to the memory 213. Here, assume that the addresses M, M+1 and M+2 are within the address space designated by the mapping address designation circuit 401, and the address M+3 is out of the designated address space. In this case, the comparator 400 outputs a signal of "0" at an intermediate point of the state B3 in which the address M+3 is outputted onto the ABD bus 219, but the output of the latch 402 is maintained at "1" without change so that the ENSAMP signal is also maintained at "1". However, thereafter, when the microprocessor 100 brings the STBF signal 303 to "1", the bus interface 201 outputs the control signal C3 of "0", and therefore, the signal of "0" from the comparator 400 is written to the latch 402. As a result, both the ENSAMP signal and the SLROM signal are brought to "0". Thus, the operation for reading data from the memory 213 is completed at the location of the memory corresponding to the address M+2.

As mentioned above, the pointers (FPM) 203 and (FPS) 204 and the output latch 215 are used in the case of the instruction code reading, and on the other hand, the pointers (DPM) 207 and (DPS) 208 and the output latch 225 are used in the case of the data reading. Therefore, even if the interrupt of the data reading operation is executed in the way of the instruction code reading operation, the instruction code reading operation is merely suspended, and restarted after the data reading operation has been completed.

As seen from the above, the microcomputer system as explained hereinbefore can read the instruction codes and the data from the memory 213 at a high speed, and also can put the memory 213 and the reading buffer 213 into an not-operating condition when the address to be accessed is out of the address space designated by the relocation control for power-saving.

Figure 9:
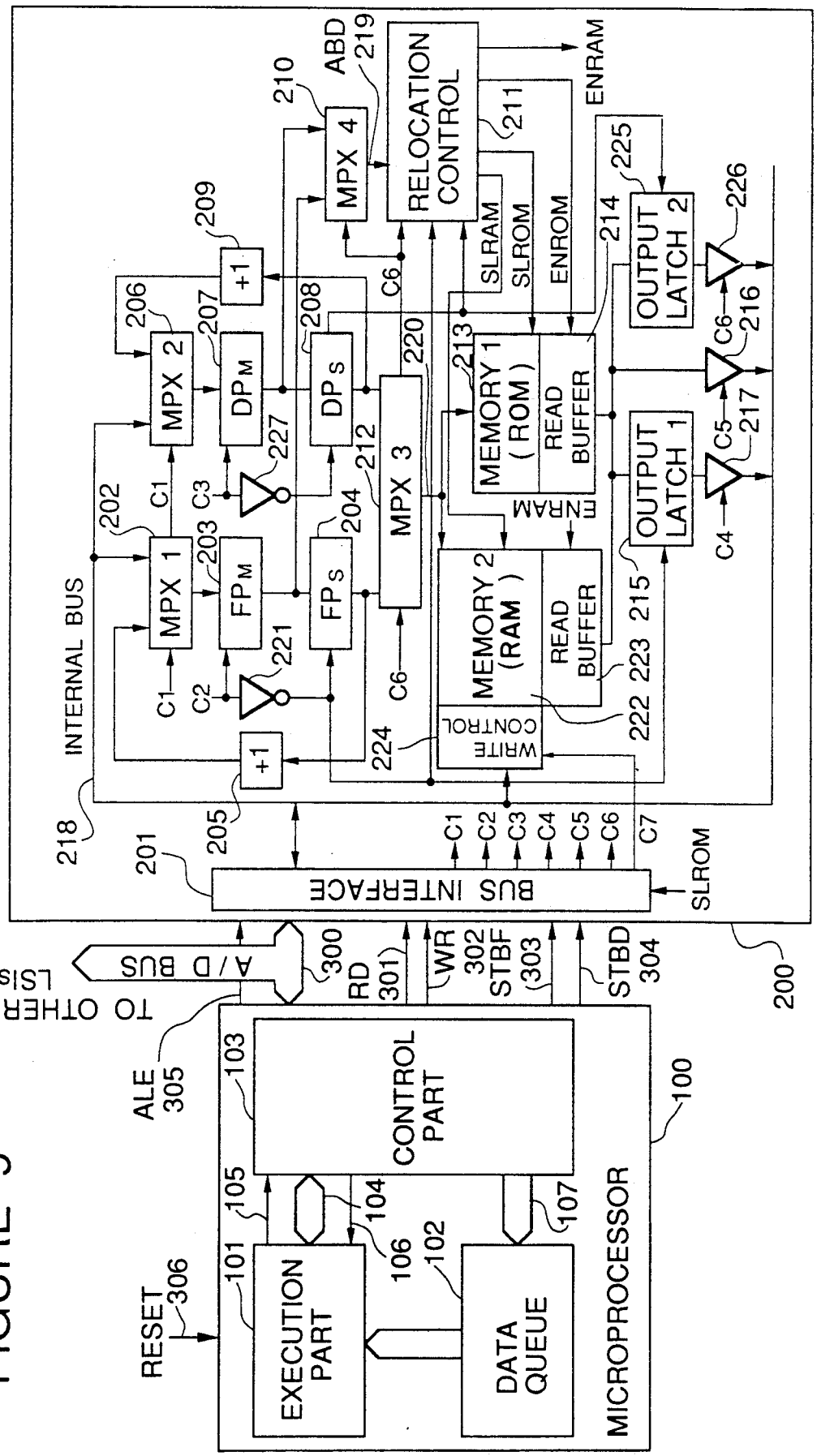
FIG. 9 is a block diagram of a second embodiment of the microcomputer system in accordance with the present invention.

Referring to FIG. 9, there is shown a block diagram of a second embodiment of the microcomputer system in accordance with the present invention, which is a modification of the first embodiment shown in FIG. 3. Therefore, elements similar to those shown in FIG. 3 are given the Reference Numerals, and explanation thereof will be omitted for simplification.

As will be seen from comparison between FIGS. 3 and 9, the second embodiment shown in FIG. 9 includes a memory 222 of the RAM (random access memory) type for allowing reading and writing of data, in addition to the memory 213 of the ROM (read only memory) type. In addition, the microprocessor 100 generates not only the read (RD) signal 301 but also a write (WR) signal 302 for writing the memory 222 with data outputted on the A/D bus after an address is outputted onto the A/D bus 300. On the other hand, the bus interface 201 generates a control signal C7 of "1" in synchronization with the WR signal 302. When the control signal C7 is brought to "1" the write date on the A/D bus 300 is outputted through the bus interface 201 to the internal bus 218, and then, the data on the internal bus 218 is written to the memory 222 by a write control 224 associated to the memory 222. In this connection, an SLRAM signal for selecting the memory 222 is generated by the relocation control 211.

Figure 10:
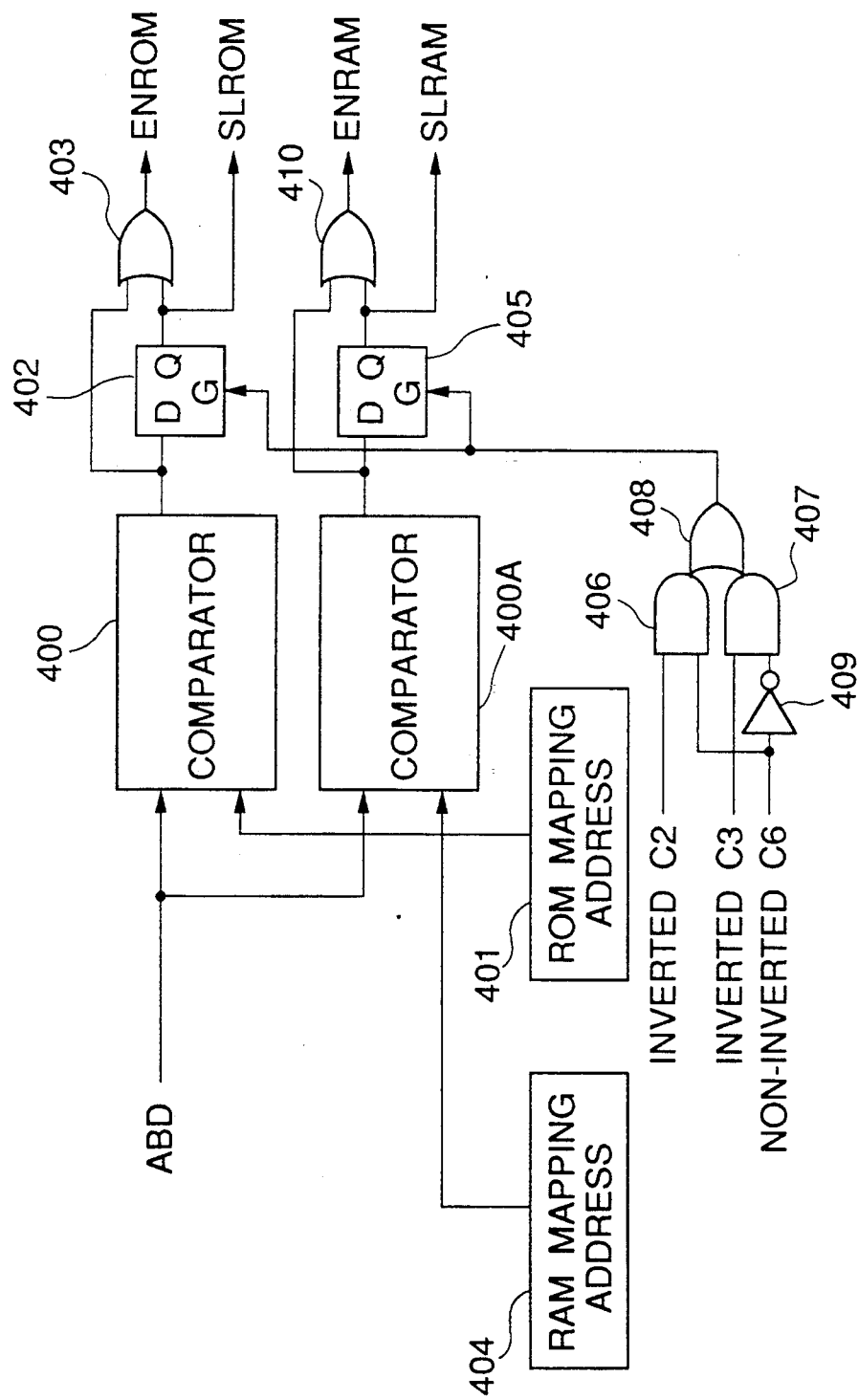
FIG. 10 is a logic diagram of the relocation control used in the microcomputer system shown in FIG. 9.

Turning to the FIG. 10, there is shown a logic diagram of the relocation control 211 used in the second embodiment shown in FIG. 9. Elements similar to those shown in FIG. 4 are given the same Reference Numerals. The relocation control 211 shown in FIG. 10 includes not only the comparator 400 receiving the address on the ABD bus 219 and the output of the (ROM) mapping address designation circuit 401 for designating the mapping extent of the memory 213, but also a second comparator 406 receiving the address on the ABD bus 219 and an output of a RAM mapping address designation circuit 404 for designating the mapping extent of the memory 222. Outputs of the comparators 400 and 406 are inputted to latches 402 and 405, respectively, which respectively generate a SLROM signal for selection of the memory 213 and a SLRAM selection of the memory 222. Further, the output of the comparator 400 and the latch 402 are coupled to an OR gate 403, which in turn generates the ENROM signal of "1" for enabling the operation of the reading buffer 214. The output of the comparator 406 and the latch 405 are coupled to an OR gate 410, which in turn generates the ENRAM signal of "1" for enabling the operation of a reading buffer 223 associated to the memory 222. The latches 402 and 405 are controlled by a latch control circuit composed of AND gate 406 and 407, an OR gate 408 and an inverter 409, similarly to the embodiment shown in FIG. 4.

An operation of the microcomputer system shown in FIG. 9 is fundamentally the same as that of the microcomputer system shown in FIG. 3, and therefore, can read data or program from the associated memories at a high speed. A difference between the microcomputer systems shown in FIGS. 3 and 9 is that the microcomputer system shown in FIG. 9 can selectively access the two kind memories 213 and 222, namely the ROM 213 and the RAM 222, under the control of the relocation control 211. Further, when the address inputted to the memories 213 and 222 is out of the mapping address space designated by the relocation control 211, the memories 213 and 222 are put into a not-operating condition by the ENROM signal, ENRAM signal, SLEOM signal and SLRAM signal outputted from the relocation control 211. Therefore, the memory is power-saving.

Figure 11:
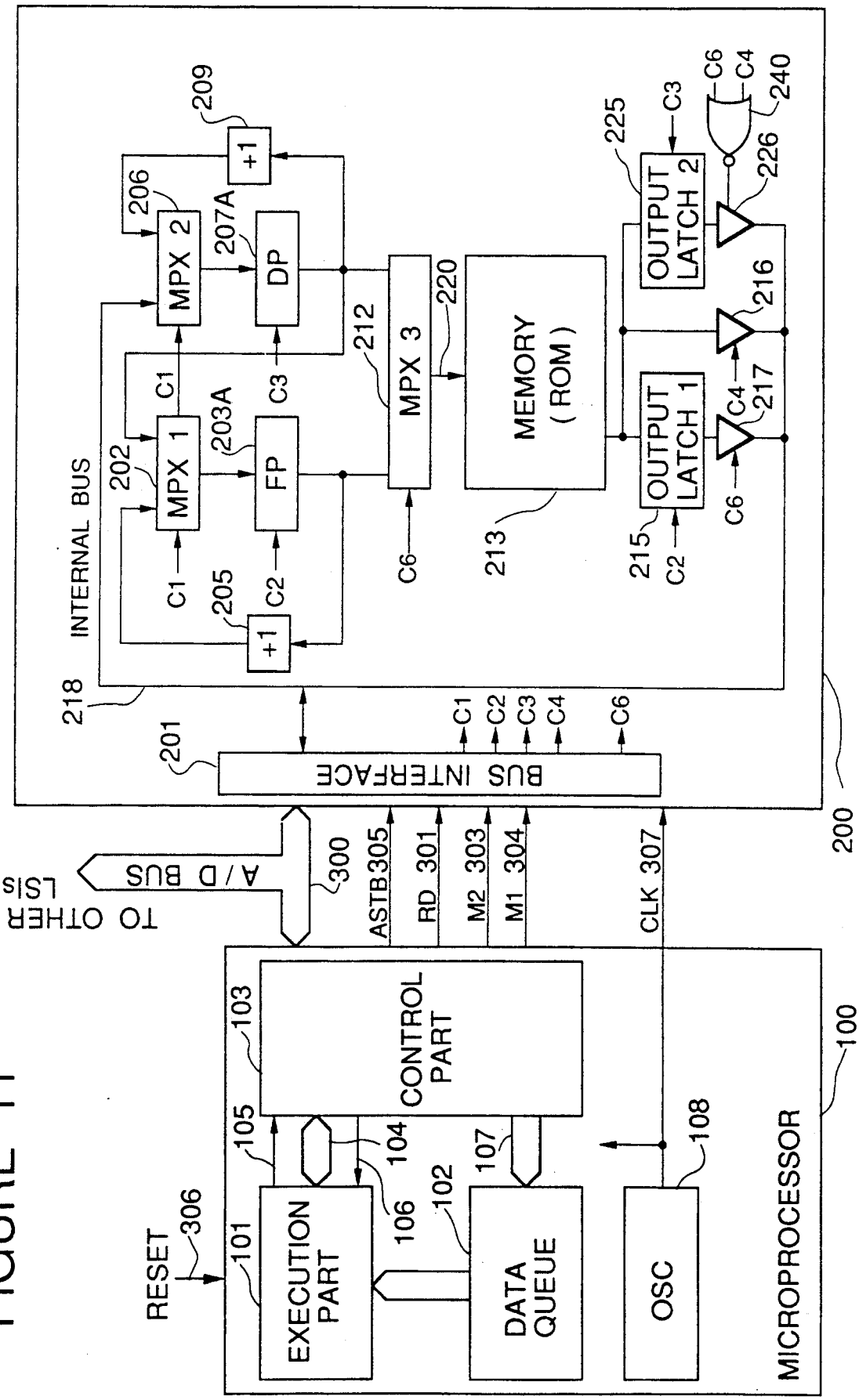
FIG. 11 is a block diagram of a third embodiment of the microcomputer system in accordance with the present invention.

Referring to FIG. 11, there is shown a block diagram of a third embodiment of the microcomputer system in accordance with the present invention. In FIG. 11, elements similar to those shown in FIG. 3 are given the same Reference Numerals, and explanation thereof will be omitted.

As seen from comparison between FIGS. 3 and 11, the microprocessor 100 of the third embodiment of the microcomputer system shown in FIG. 11 includes a clock oscillator 108 for generating a clock for the operation of the microprocessor 100 itself. The clock generated by the clock oscillator 108 is supplied as a basic operation clock 307 to the LSI 200 for synchronization of the reading of the instruction codes and data.

On the other hand, the bus interface 201 of the LSI 200 generates the control signals C1, C2, C3, C4 and C6. Namely, the control signal C5 is not generated. Here, it should be noted that the control signals C1, C2, C3, C4 and C6 are not necessarily the same as those in the first embodiment. Furthermore, the LSI 200 of the third embodiment includes a pointer (FP) 203A in place of the master-slave pointers (FPM) 203 and (FPS) 204 and the inverter 221, and also a pointer (DP) 207A in place of the master-slave pointers (DPM) 207 and (DPS) 208 and the inverter 227. The first input of the multiplexer 202 is connected to an output of the pointer 207A, in place of the internal bus 218. The pointer 203A is controlled by the control signal C2 and the pointer 207A is controlled by the control signal C3. In addition, the multiplexor 210 and the relocation control 211 are omitted from the third embodiment. Therefore, the SLROM signal and the ENSAMP signal are not generated.

Furthermore, the output latches 215 and 225 are controlled by the non-inverted control signals C2 and C3, respectively, not by the inverted control signals C2 and C3 supplied from the inverters 221 and 227 in the first embodiment. In addition, the output buffer 217 is controlled by the control signal C6, and the output buffer 216 is controlled by the control signal C4. The output buffer is controlled by an output of a NOR gate 240 receiving the control signals C4 and C6.

Explanation will be made on the control signals inputted to or outputted from the microprocessor 100 and the LSI 200.

A reset signal 306 is inputted to the microprocessor 100 for initialize the internal hardwares of the microprocessor 100. On the other hand, the microprocessor 100 generates an ASTB signal 305 (corresponding to the ALE signal in the first embodiment) for causing the address on the A/D bus 300 to be latched to the pointer (FP) 203A or (DP) 207A, and a read (RD) signal 305 for reading data (or instruction code) from the memory 213. The RD signal 301 is active when it is at a low level. The microprocessor 100 also generates a first mode (M1) signal 304 for setting the mode of reading from the memory 213, and a second mode (M2) signal 303 for for controlling the continuous instruction code reading and continuous data reading and for setting the mode of continuous reading. In addition, the basic operation clock 307 is supplied to the LSI 200 as the synchronization clock for the the continuous instruction code reading cycle and the continuous data reading cycle.

Under the above mentioned condition, when the ASTB signal 305 is "1", the reading mode is determined by the levels of the M1 and M2 signals 304 and 303. Specifically, when the ASTB signal 305 is "1", if the the M1 and M2 signals 304 and 303 are at "1" and "0", respectively, the continuous instruction code read cycle is set. When the ASTB signal 305 is "1", if the the M1 and M2 signals 304 and 303 are at "0" and "0", respectively. If the M1 and M2 signals 304 and 303 are at "0" and "1", respectively, a one-time data read cycle is set.

Figure 12:
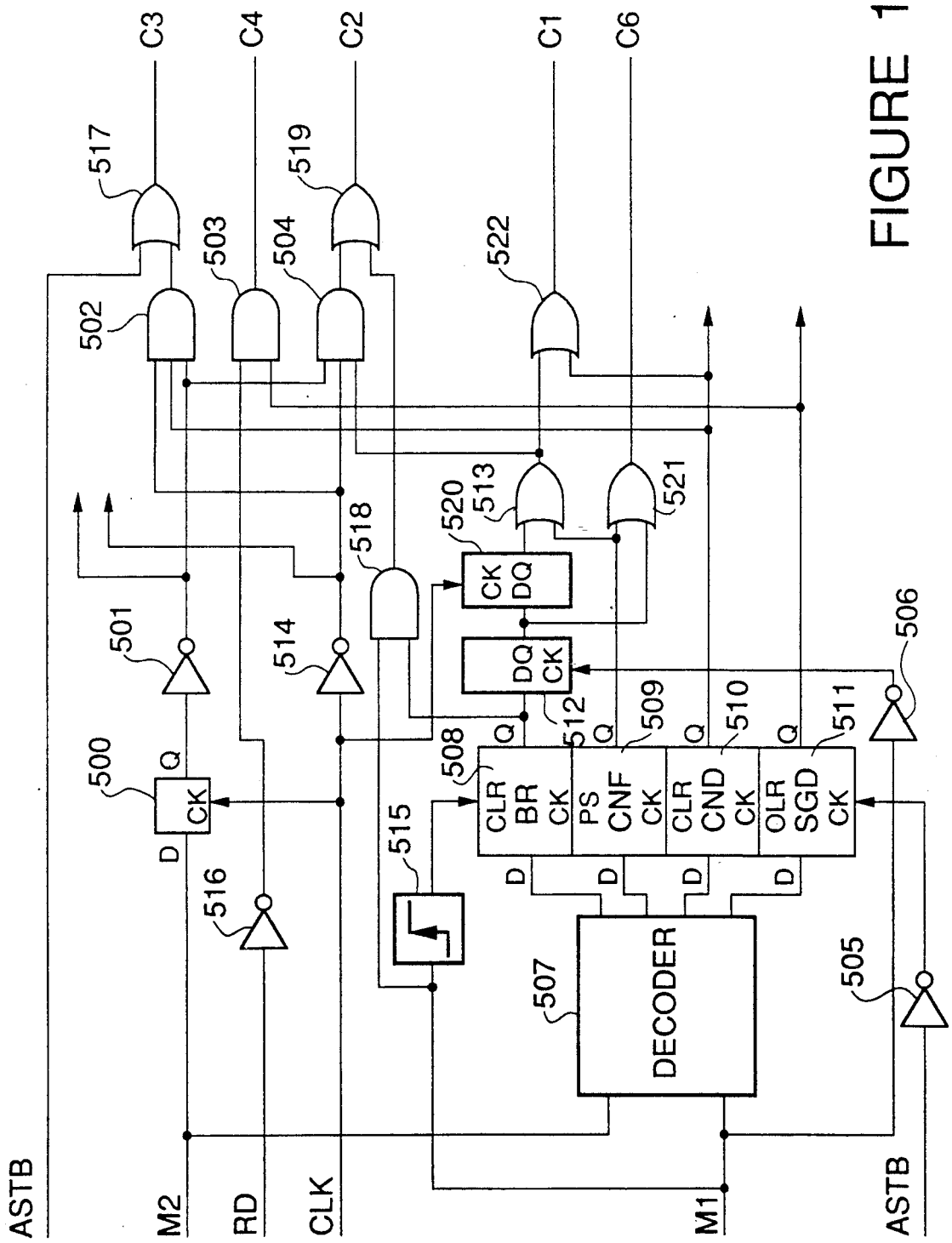
FIG. 12 is a detailed logic circuit diagram of the bus interface used in the microcomputer system shown in FIG. 11.

Turning to FIG. 12, there is shown a detailed logic circuit diagram of the bus interface 201 shown in FIG. 11. The shown bus interface 201 includes a flipflop 500 which latches the M2 signal 303 at the rising edge of the clock 307. The M1 signal 304 and the M2 signal 303 are supplied to a decoder 507 having four outputs connected to four flipflops 508, 509, 510 and 511, respectively. When the M1 signal 304 and the M2 signal 303 are "1" and "0", respectively, the decoder 507 generates a high level ("1") signal at its output connected to the flipflop 508. In addition, when the M1 signal 304 and the M2 signal 303 are "1" and "1", respectively, the decoder 507 generates a high level ("1") signal at its output connected to the flipflop 509. When the M1 signal 304 and the M2 signal 303 are "0" and "1", respectively, the decoder 507 generates a high level ("1") signal at its output connected to the flipflop 510. Furthermore, when the M1 signal 304 and the M2 signal 303 are "0" and "0", respectively, the decoder 507 generates a high level ("1") signal at its output connected to the flipflop 511. The flipflops 508, 509, 510 and 511 receive the ASTB signal 305 at their control input through an inverter 505, so that the flipflops 508, 509, 510 and 511 latch the corresponding outputs of the decoder 507 at the falling edge of the ASTB signal 305. In addition, a rising edge detector 515 receives the M1 signal 304 and generates a detection signal at the rising edge of the M1 signal 304. The flipflops 508, 510 and 511 are cleared to "0" by the detection signal generated by the rising edge detector 515. On the other hand, the flipflop 509 is set to "1" at the same timing. As a result, the flipflop 508 is written with "1" in an address setting cycle of the continuous instruction code read cycle, and the flipflop 509 is written with "1" in a reading cycle of the continuous instruction code read cycle. The flipflop 510 is written with "1" in the continuous data read cycle, and the flipflop 510 is written with "1" in a one-time data read cycle.

A flipflop 512 is connected at its input to the output of the flipflop 508 to latch the output of the flipflop 508 at the rising edge of the M1 signal 304. An output of the flipflop 512 is connected to an input of another flipflop 520 receiving the clock 307 at its clock input 520, so that the output of the flipflop 512 is written to the flipflop 520 at the rising edge of the clock 307. An output of the flipflop 520 is connected to a first input of an OR gate 513, which is in turn connected at its second input to the output of the flipflop 509. An output of the OR gate 513 is connected to a first input of an OR gate 522, which is in turn connected at its second input to the output of the flipflop 510. Thus, the OR gate 522 generates the control signal C1 which assumes the level of "1" when the content of the memory 213 should be continuously read out.

The M1 signal 304 is connected to a first input of an AND gate 518, which is in turn connected at its second input to the output of the flipflop 508. An output of the AND gate 513 is connected to a first input of an OR gate 519, which is in turn connected at its second input to an output of a three-input AND gate 504. The AND gate 504 is connected at its first input to the output of the OR gate 513, and at its second input to receive the clock 307 through an inverter 514. The third input of the AND gate 504 is connected to an output of the flipflop 500 through an inverter 501. Thus, the OR gate 519 generates the control signal C2 which assumes the level of "1" in the continuous instruction code read cycle. The control signal C2 is brought to "0" when the M2 signal 303 is "0" and the clock is "0". On the other hand, when the M1 signal 304 is "1", the control signal C2 assumes the level of "1".

The output of the inverter 501 connected at its input the output of the flipflop 500 is connected to a first input of a three-input AND gate 502. The AND gate 502 is connected at its second input to the output of the flipflop 510 and at its third input to the output of the inverter 514. An output of the AND gate 502 is connected to one input of an OR gate 517, which is connected to receive at its second input the ASTB signal 305. Thus, the OR gate generates at its output the control signal C3, which assumes the level of "1" when the ASTB signal 305 is "1" or when the M2 signal 303 is "0" and the clock 307 is at "0" in the continuous data read cycle.

The RD signal 301 is supplied to an inverter 516, whose output is connected to a first input of an AND gate 503. The AND gate 503 is connected at its second input to the output of the flipflop 511, and generates at its output the control signal C4 which assumes the level of "1" when the RD signal 301 is "0" in the one-time data read cycle.

The output of the flipflop 509 and the output of the flipflop 512 are coupled to an OR gate 52 which generates at its output the control signal C6 which assumes the level of "1" in the continuous instruction code read cycle.

Figure 13:
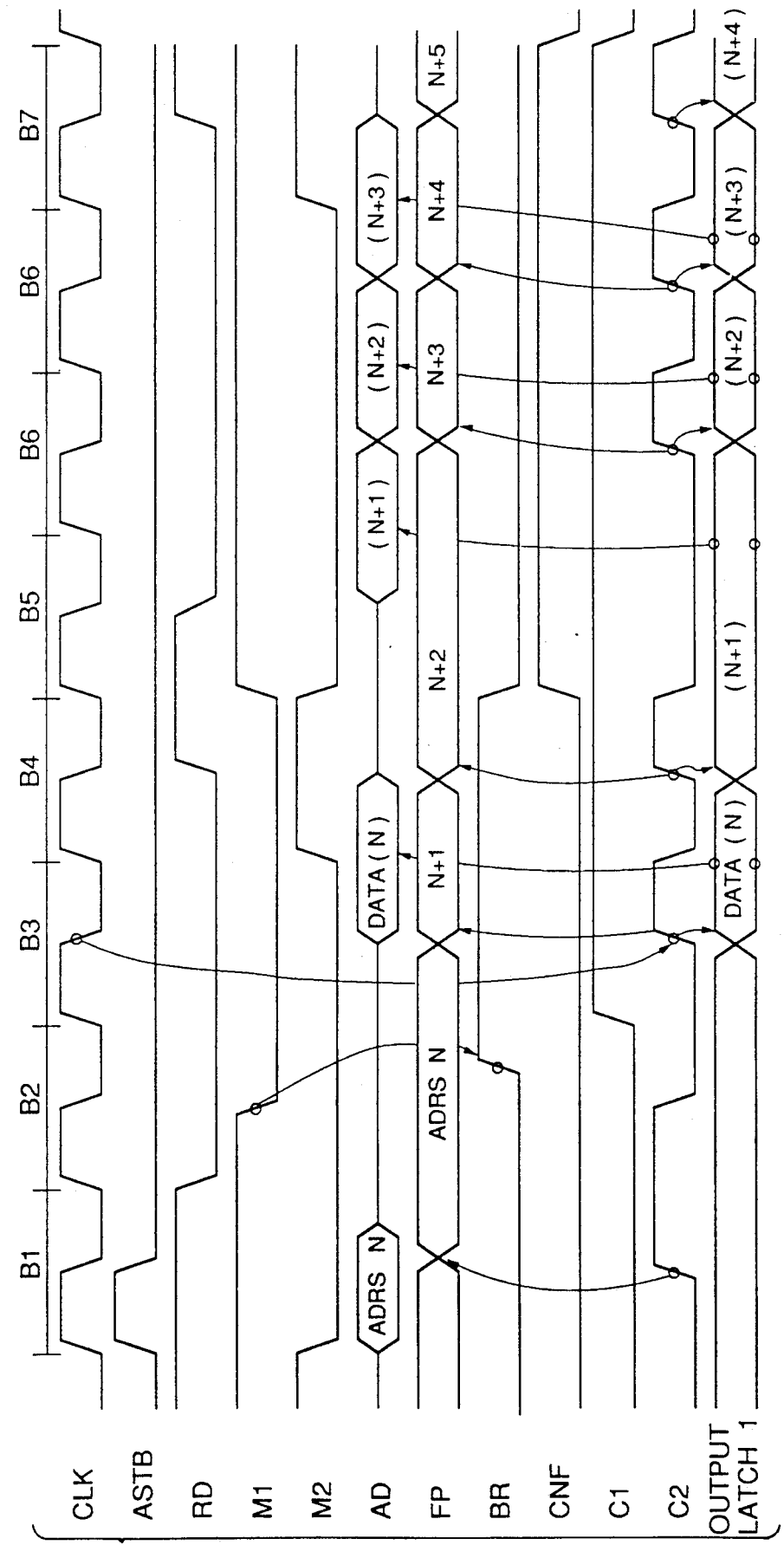
FIG. 13 is the timing chart illustrating the operation of the microprocessor shown in FIG. 11 in the continuous instruction code read cycle.

Now, the continuous instruction code read cycle of the third embodiment will be explained with reference to FIG. 13.

The continuous instruction code read cycle is composed of four basic states B1, B2, B3 and B4 for setting an address, and three states B5, B6 and B7 succeeding to the basic states for the continuous instruction code reading. Here, the basic state will be called "BR state", and the state for the continuous instruction code reading will be called "SNF state". Each of the states is composed of a plurality of clocks, and in the respective states, the control part 103 of the microprocessor 100 outputs the above mentioned various control signals to the LSI 200 for the purpose of controlling the cycle for reading the content of the memory 213. Incidentally, in order to continue or maintain the continuous instruction code reading, the state B6 is repeated.

First, in the state B1, the microprocessor 100 brings the ASTB signal 305 to "1" and the M1 signal 304 and the M2 signal 303 to "1" and "0", respectively. In addition, the microprocessor 100 outputs the address N onto the A/D bus 300. On the other hand, the bus interface 201 of the LSI 200 brings the control signals C1 and C2 to "1", respectively, and outputs the address N on the A/D bus 300 to the internal bus 218. As result, the address N is written to the pointer (DP) 207A through the multiplexor 206 receiving the control signal C1 of "1".

At an intermediate point of the state B1, the ASTB signal 305 is brought to "0", and therefore, the flipflop 508 brings its output to "1". When the ASTB signal 305 falls down, the control signal C2 is brought to "1", so that the content N on the pointer 207A is written to the pointer 203A through the multiplexor 202.

At an intermediate point of the next state, namely, the state B2, the M1 signal 304 is brought to "0", so that the control signal C2 is also brought to "0". With this, the writing to the pointer 203A has been completed. At this time, the output of the flipflop 512 is brought to "1", and therefore, the control signal C6 is brought to "1", so that the content of the pointer (FP) 203A is supplied to the memory 213 through the multiplexor 212. As a result, an instruction code (N) is read out from a location of the memory 213 indicated by the address N.

In the state B3, when the clock 307 is brought to "1", the output of the flipflop 520 is brought to "1", so that the control signal C1 is brought to "1". Therefore, the multiplexor 202 selects the output of the incrementer 205. When the clock 307 is brought to "0" at an intermediate of the state B3, the control signal C2 is brought to "1", so that the output (N) of the memory is written to the latch 215. At the same time, the next address N+1 obtained from the output of the incrementer 205 is written to the pointer (FP) 203A. Furthermore, since the control signal C6 is "1", the content (N) of the output latch 215 is outputted through the output buffer 217 to the internal bus 218. The content (N) on the internal bus 218 is outputted through the bus interface 201 to the A/D bus 300. The control part 103 of the microprocessor 100 fetches the content (N) on the A/D bus 300 in synchronization with the "1" level of the clock 307 in the state B4, and then, transfers the content (N) to the data queue 102. On the other hand, the execution part 101 decodes the instruction code (N) and executes an operation corresponding to the instruction code (N).

Thereafter, the M2 signal 303 is brought to "0" at a beginning of the state B4, and then, the clock 307 is brought to "0" at an intermediate point of the state B4. As a result, the control signal C2 is brought to "1", and therefore, the output latch 215 latches an instruction code (N+1) corresponding to the address N+1. On the other hand, the next address N+2 is written to the pointer 203A. At this time, since the RD signal 301 is brought to "1", the bus interface 201 generates no output onto the A/D bus 300. At a beginning of the state B5, the M1 signal 304 is brought to "1", and therefore, the outputs of the flipflops 508, 510 and 511 are brought to "0" and the output of the flipflop 509 is brought to "1". On the other hand, the control signals C1 and C6 are maintained at "1". In addition, the M2 signal 303 is brought to "0". At an intermediate point of the state B5, the RD signal 301 is brought to "0", so that the instruction code (N+1) is outputted to the A/D bus 300. The clock 307 is brought to "0" at the intermediate point of the state B5, but since the M2 signal 303 has been brought to "1" in the state B4, and therefore, the output of the inverter 501 is maintained at "0", the control signal C1 is maintained at "0".

At an intermediate point of the state B6, the output of the inverter 501 is brought to "1". Therefore, when the clock 307 is brought to "0", the control signal C2 is brought to "1", so that an instruction code (N+2) corresponding to the address N+2 is written to the output latch 215. Accordingly, the instruction code (N+2) is outputted to the A/D bus 300. At the same time, the next address N+3 is written to the pointer 203A.

In the repeated or second state B6, similarly, an instruction code (N+3) corresponding to the address N+3 is written to the output latch 215, and then outputted to the A/D bus 300.

At a beginning of the final state B7, the M2 signal 303 is brought to "1", and the RD signal 301 is brought to "1" at an intermediate point of the state B7. Therefore, the bus interface 201 will deliver no output on the A/D bus 300 after the instruction code (N+3). Furthermore, since the control signal C2 is brought to "1" at the intermediate point of the state B7, the content of the pointer 203A is brought to an address "N+5", and on the other hand, an instruction code (N+4) corresponding to the address N+4 is written to the output latch 215. With this, the continuous instruction code reading cycle has been completed. In a state following the state B7, the output of the inverter 501 is brought to "0", the control signal C2 is maintained at "0".

As seen from the above, in the continuous instruction code reading cycle, instruction codes stored in the memory 213 are continuously read out to the A/D bus 300 in synchronization with the rising of the clock 307 by action of the pointer 203 and the output latch 215, so that the microprocessor 100 can perform an operation corresponding to the read-out instruction codes.

Figure 14:
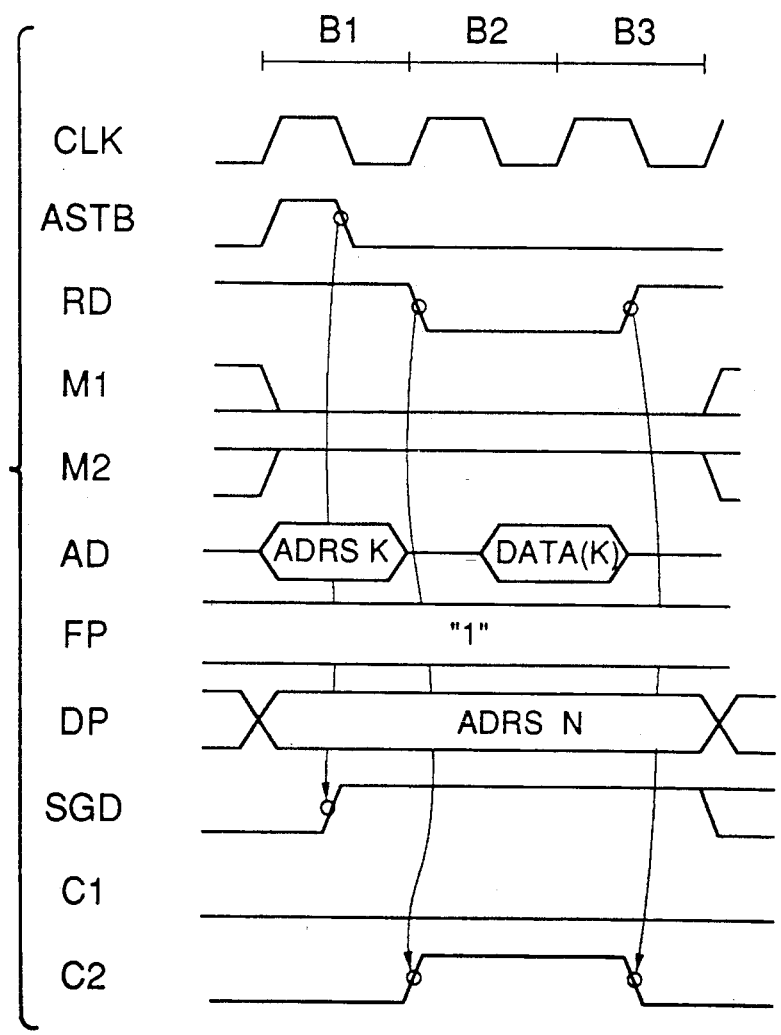
FIG. 14 is the timing chart illustrating the operation of the microprocessor shown in FIG. 11 in the one-time data read cycle.

Now, a one-time data read cycle of the third embodiment will be explained with reference to FIG. 14.

One data read cycle is composed of three state B1, B2 and B3. In the state B1, the microprocessor 100 brings the ASTB signal 305, the M1 signal 304 and the M2 signal 303 to "1", "1" and "1", respectively. In addition, the microprocessor 100 outputs an address K onto the A/D bus 300. Furthermore, the control signal C3 is brought to "1", and therefore, the address K is written to the pointer (DP) 207A through the multiplexor 206, so that the a location of the memory 213 corresponding to the address K is accessed. When the ASTB signal 305 is brought to "0" at an intermediate point of the state B1, the output of the flipflop 511 is brought to "1". Therefore, when the RD signal 301 is brought to "0" in the state B2, the control signal C4 is brought to "1", so that the output buffer 216 outputs data (K) read out from the memory at a location corresponding to the address K, to the internal bus 218. On the other hand, microprocessor 100 brings the RD signal 301 to "0" at an intermediate point of the state B2, and therefore, the bus interface 201 outputs the data K onto the A/D bus 300. The RD signal 301 is brought to "1" at an intermediate point of the state B3, and on the other hand, the data (K) on the A/D bus 300 is fetched by the microprocessor 100 at a predetermined timing within the state B3 and then used by the execution part 101 as the data for the arithmetic and logic operation. Since the control signal C2 is maintained at "0" during a period of the one-time data reading cycle, the content of the pointer 203A is maintained in an idle (I) condition.

Figure 15:
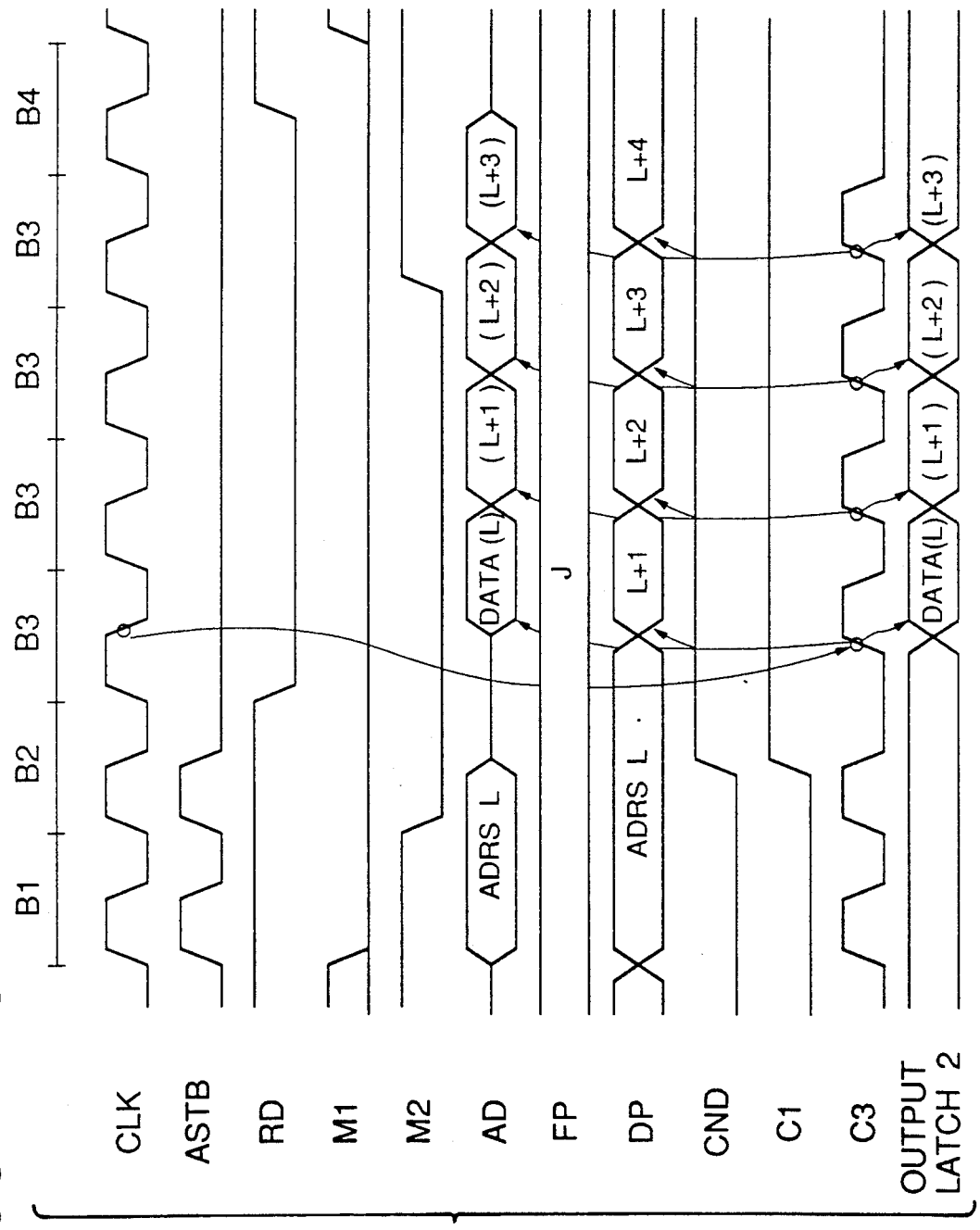
FIG. 15 is the timing chart illustrating the operation of the microprocessor shown in FIG. 11 in the continuous data read cycle.

Next, an operation of the continuous data read cycle will be explained with reference to FIG. 15. The continuous data read cycle is constituted of basic states B1, B2, B3 and B4, and the continuous data reading is realized by repeating the state B3.

In the state B1, the microprocessor 100 brings the ASTB signal 305, the M1 signal 304 and the M2 signal 303 to "1", "0" and "1", respectively. In addition, the microprocessor 100 outputs an address L onto the A/D bus 300. In response to the outputs of the microprocessor 100, the bus interface 201 of the LSI 200 brings the control signal C3 to "1". In response to the control signal C3 of "1", the address L is written to the pointer 207A through the multiplexor 206. The output of the flipflop 511 is brought to "1" at an intermediate point of the state B1. Furthermore, the ASTB signal 305 is brought to "1" at a beginning of the state B2, and at the same time, the M2 signal 303 is brought to "0". Accordingly, the output of the flipflop 510 is brought to "1" at an intermediate point of the state B2, so that the control signal C1 is brought to "1". As a result, the address L is supplied through multiplexor 212 to the memory 213, so that data (L) corresponding to the address L is read out from the memory 213.

At an intermediate point of the state B3, the clock 307 is brought to "0", and therefore, the control signal C3 is brought to "1", so that the data (L) is written to the latch 225. At the same time, since the control signal C1 is "1", the output (address L+1) of the incrementer 209 is written to the pointer 207A. On the other hand, since the control signals C4 and C6 are "0", the output of the NOR gate 240 is "1". Therefore, the output buffer 226 is in an operating (conductive) condition, so that the data (L) outputted from the memory 213 is outputted to the internal bus 218. The bus interface 201 then outputs the data (L) to the A/D bus 300.

The microprocessor 100 fetches the data (L) on the A/D bus 300 at the timing of "1" of the clock 307 in the next state B3. The above mentioned operation will be repeated in the succeeding B3 states. In the last B3 state, the microprocessor 100 brings the M2 signal 303 to "1". As a result, the output of the inverter 501 is brought to "0" in the state B4. Therefore, even if the clock 307 is brought to "0", the control signal C3 of "1" is never outputted in the state B4.

In the state B4, the microprocessor 100 brings the RD signal 301 to "1" so that the continuous data read cycle is completed.

As mentioned above, in the continuous data read cycle, the content of the pointer 207A is updated in synchronization with the falling of the clock 307, and the data at an address corresponding to the content of the pointer 207A is continuously read out from the memory 213 through the output latch 225. In this process, the control signal C2 is maintained at "0", and therefore, the content of the pointer 203A will not change.

As seen from the above, the third embodiment of the microcomputer system as explained hereinbefore can continuously read the instruction codes and the data from the memory 213 in synchronization with the basic operation clock 307 by action of the M2 signal controlled by the microprocessor 100. In addition, the one-time data reading can be performed.

Figure 16:
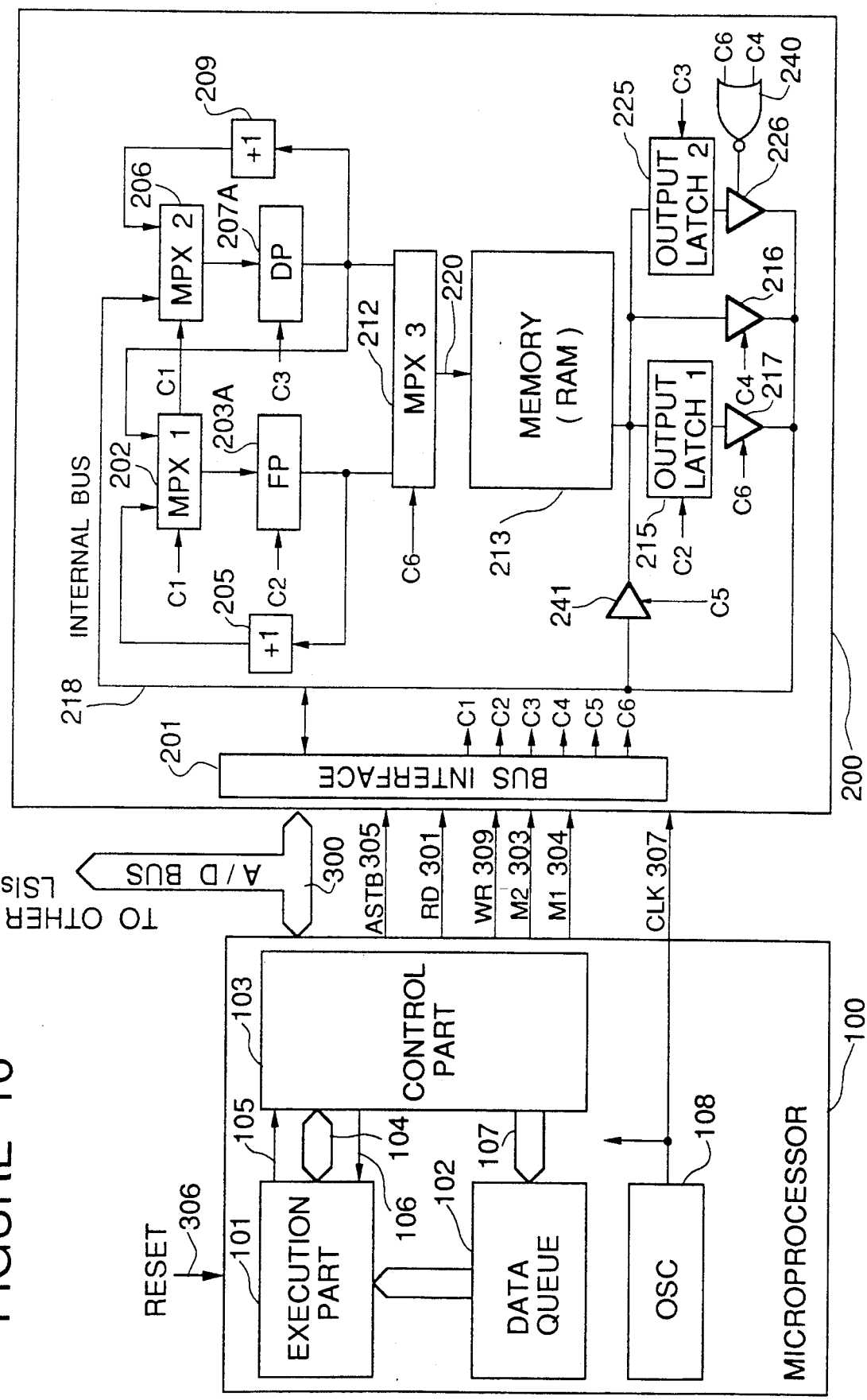
FIG. 16 is a block diagram of a fourth embodiment of the microcomputer system in accordance with the present invention.

Referring to FIG. 16, there is shown a block diagram of a fourth embodiment of the microcomputer system in accordance with the present invention, which is a modification of the third embodiment shown in FIG. 11. Therefore, in FIG. 16, elements similar to those shown in FIG. 11 are given the Reference Numerals, and explanation thereof will be omitted for simplification.

In the fourth embodiment, the memory 213 is composed of a RAM allowing the data reading and the date writing. Furthermore, in addition to the signals generated in the third embodiment, the microprocessor 100 generates a low active write (WR) signal 309 and the bus interface 201 generates a control signal C5. And, a writing buffer 241 is added to the LSI 200, as shown in FIG. 16.

Figure 17:
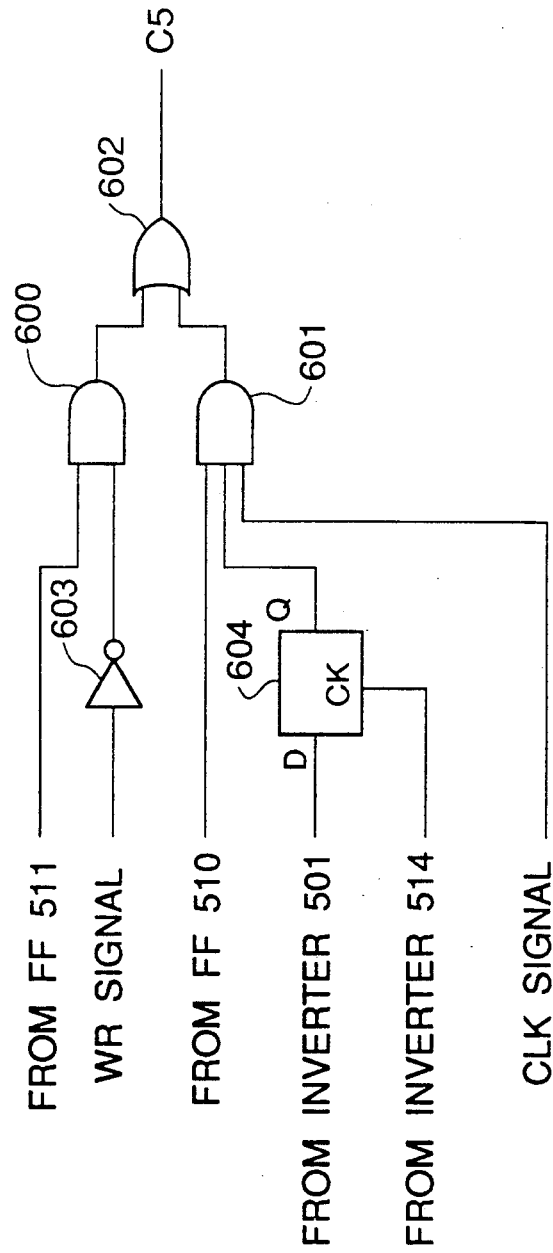
FIG. 17 is a detailed logic circuit diagram of a circuit to be combined with circuit shown in FIG. 12 for forming the bus interface shown in FIG. 16.

FIG. 17 shows a logic diagram of a circuit for generating the control signal C5. The shown circuit includes an AND gate 600 having a first input connected to receive the output of the flipflop 511 shown in FIG. 12, and a second input connected to receive the WR signal 309 through an inverter 603. Furthermore, there is provided a three-input AND gate 601 having a first input connected to receive the output of the flipflop 510 shown in FIG. 12, and a second input connected to an output of a flipflop 604 which receives at its data input the output of the inverter 501 shown in FIG. 12 and at its clock input the output of the inverter 514 shown in FIG. 12. A third input of the AND gate 601 is connected to receive the clock 307. Outputs of the AND gates 600 and 601 are coupled to an OR gate 602 which generates the control signal C5.

Now, the fourth embodiment will be explained only on a portion differing from the third embodiment. The microprocessor 100 outputs a write data onto the A/D bus 300 after outputting an address onto the A/D bus 300, and also generates the WR signal 309 to the LSI 200 for writing the write data to the memory 213. In the circuit shown in FIG. 17, when the output of the flipflop 511 is "1" and the WR signal 309 is "0", the AND gate 600 generates a signal of "1", and therefore, the OR gate 602 generates the control signal C5 of "1". The flipflop 604 is written with the output of the inverter 501 at the falling edge of the clock 307 (namely, the rising edge of the output of the inverter 514). Thereafter, when the outputs of the flipflop 510 and the flipflop 604 are at "1", and when the clock 307 is at "1", the output of the OR gate becomes "1", and therefore, the control signal C5 becomes "1".

If the control signal C5 is at "1", the writing buffer 241 is in an operating (conductive) condition, the data on the internal bus 218 is written to the memory 213.

Figure 18:
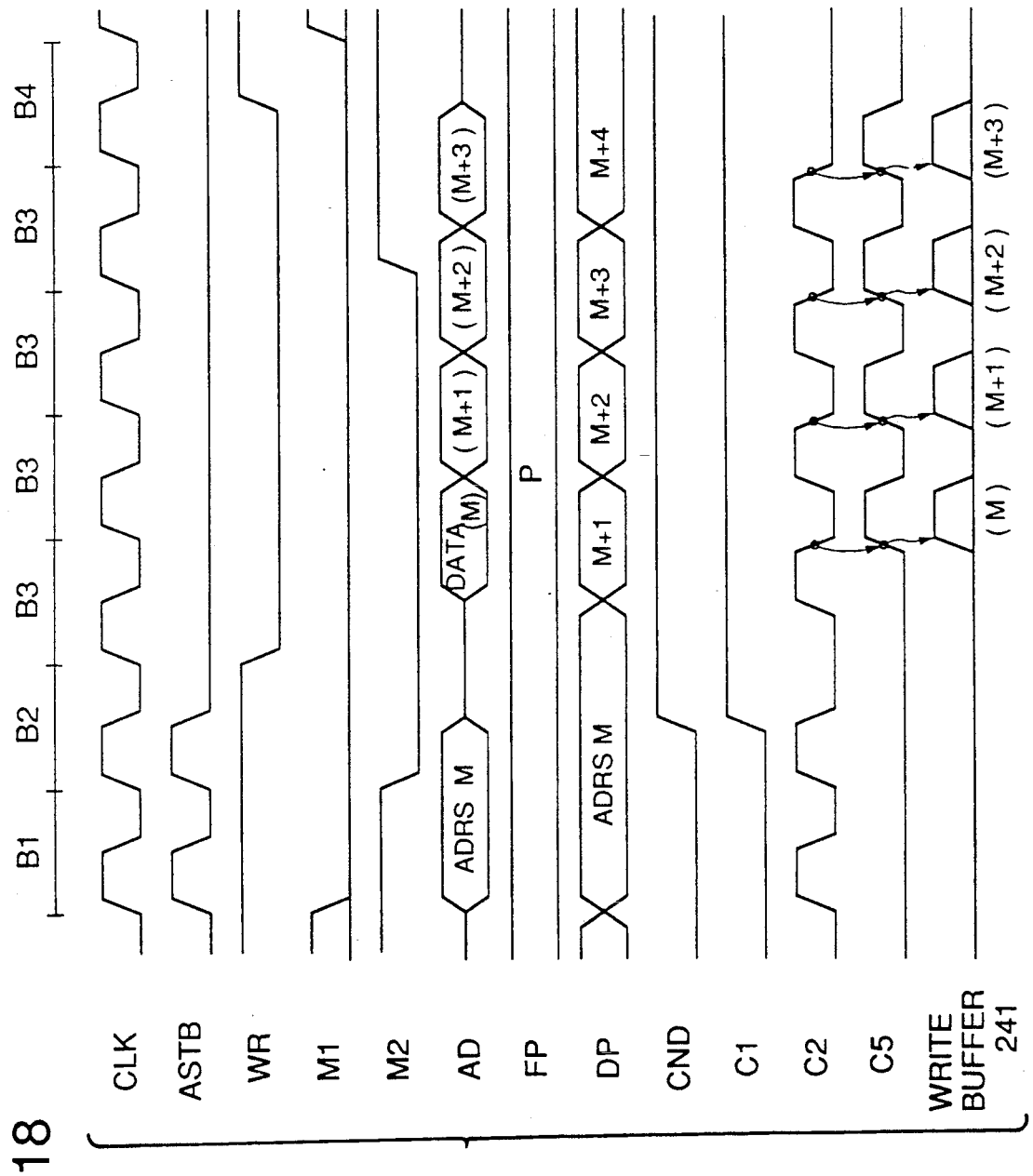
FIG. 18 is the timing chart illustrating the operation of the microprocessor shown in FIG. 16 in the continuous data writing cycle.

Now, explanation will be made on the continuous data writing cycle of the fourth embodiment with reference to FIG. 18. The continuous data writing cycle is composed of the states B1, B2, B3 and B4, the states B1 and B2 of which are the same as those of the continuous data reading cycle of the third embodiment as mentioned above, and therefore, explanation thereof will be omitted.

In the state B3, the microprocessor 100 brings the WR signal 309 to "0", and outputs onto the A/D bus 300 the data that should be stored at an address M of the memory 213. Since the output of the flipflop 604 is brought to "1" at an intermediate point of the state B3, the control signal C5 is brought to "1" when the clock 307 becomes "1" in the second B3 state. As a result, the writing buffer 241 is rendered conductive, so that the data (M) is supplied through the bus interface 201 and the internal bus 218 and then written through the writing buffer 241 to the memory 213. In the succeeding B3 states, a similar operation is repeated, and in a final B3 state, the M2 signal 303 is brought to "1", so that the control signal C5 is brought to "1" once in the state B4, and thereafter, is brought and maintained to "0". In the state B4, the data (M+3) is written to an address M+3 of the memory 213. On the other hand, the microprocessor 100 brings the WR signal 309 to "1" at an intermediate point of the state B4, so that the continuous data writing cycle is completed. In the process of continuous data writing cycle, the control signal C2 is maintained at "0", the content of the pointer 203A will change its content.

As mentioned above, in the continuous data writing cycle, the data is continuously written to the memory 213 in synchronization with the basic operation clock 307 by action of the M2 signal controlled by the microprocessor 100. The continuous instruction code reading cycle, the one-time data reading cycle and the continuous data reading cycle of the fourth embodiment are the same as those of the third embodiment, and therefore, explanation thereof will be omitted.

As seen from the above explanation, the microcomputer system in accordance with the present invention is characterized by the provision of the address pointer associated with the incrementer and the output latch for latching the read-out data from the memory. With this arrangement, the microcomputer system can continuously pre-read data or instruction code at an address next to the address of the data or instruction code which is being outputted on the A/D bus.

In addition, in the first and second embodiments, the relocation control detects mapping address of the memory prior to the actual access to the memory. Therefore, if the address to be accessed is out of the mapping address space of the memory, the power consumption of the memory can be saved.

In the third and fourth embodiments, furthermore, the basic operation clock for the microprocessor is used as a synchronization signal for continuously reading the data or instruction codes, and therefore, the reading operation of the instruction codes or data is performed substantially concurrently with the operation of the microprocessor, namely without a substantial delay from the operation of the microprocessor. As a result, the instruction codes or data can be continuously read out at a high speed, so that the memory capable of improving the processing capacity of the microprocessor can be realized, and a high performance microcomputer system can be provided.

The invention has thus been shown and described with reference to the specific embodiments. However, it should be noted that the present invention is in no way limited to the details of the illustrated structures but changes and modifications may be made within the scope of the appended claims.

I claim:

1. A microcomputer system which includes a memory storing processing data including instruction codes, and a data processor for executing a given instruction, the system comprising:
    address indication means for storing an address for the memory and for supplying a stored address to the memory,
    updating means for updating contents of the address indication means,
    hold means for holding a content read out from the memory in accordance with the address supplied from the address indication means,
    control means for controlling the updating means and the hold means,
    first transfer means for controlling the address indication means and the hold means so as to cause a one-time transfer to be performed, without using the hold means as an intermediary, between the memory and the data processor after an address is supplied from the data processor to the address indication means, and
    second transfer means for putting the control means in an operating condition to cause the hold means to hold the contents which are read out from the memory at the address supplied by the address indication means, and also to cause the updating means to update the contents of the address indication means such that a continuous transfer is realized between the memory and the data processor through the hold means as an intermediary without continuously supplying addresses from the data processor.

2. A microcomputer system as claimed in claim 1 wherein the microcomputer system generates a basic operation clock, and the updating means and the hold means are controlled by the control means in synchronization with the basic operation clock.

3. A microcomputer system as claimed in claim 1 further including address designation means for designating an address space in which the memory is located, detection means for detecting whether or not the address indicated by the address indication means is within the address space designated by the address designation means, before the address indicated by the address indication means is supplied to the memory and means for putting the memory into an operating condition on the basis of the detection result of the detection means.

4. A microcomputer system which includes:
a memory storing processing data including instruction codes, and
a data processor for executing an instruction, wherein the memory includes an address pointer for indicating an address for the memory and for supplying a stored address to the memory, an incrementer for incrementing the address pointer, a latch coupled to the memory for holding an output of the memory read out in accordance with the address supplied from the address pointer, and a bus interface controlling the address pointer and the incrementer to cause a one-time transfer to be performed, without using the latch as an intermediary, between the memory and the data processor after an address is supplied from the data processor to the address pointer, the bus interface also controlling the address pointer, the incrementer and the latch such that the latch holds contents which are read out from the memory at the address supplied by the address pointer, and also controlling the incrementer to increment the address pointer such that a continuous transfer is realized between the memory and the data processor through the latch as an intermediary without continuously supplying addresses from the data processor.

* * * * *